(12) United States Patent
Peng et al.

(10) Patent No.: US 11,704,464 B2
(45) Date of Patent: Jul. 18, 2023

(54) INTEGRATED CIRCUIT INCLUDING MISALIGNED ISOLATION PORTIONS

(71) Applicant: TAIWAN SEMICONDUCTOR MANUFACTURING CO., LTD., Hsinchu (TW)

(72) Inventors: Shih-Wei Peng, Hsinchu (TW); Chih-Ming Lai, Hsinchu (TW); Jiann-Tyng Tzeng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 35 days.

(21) Appl. No.: 17/365,897

(22) Filed: Jul. 1, 2021

(65) Prior Publication Data
US 2021/0334446 A1 Oct. 28, 2021

Related U.S. Application Data

(62) Division of application No. 16/850,849, filed on Apr. 16, 2020, now Pat. No. 11,080,454.

(60) Provisional application No. 62/894,320, filed on Aug. 30, 2019.

(51) Int. Cl.
*G06F 30/392* (2020.01)
*H01L 23/538* (2006.01)

(52) U.S. Cl.
CPC ........ *G06F 30/392* (2020.01); *H01L 23/5384* (2013.01); *H01L 23/5386* (2013.01)

(58) Field of Classification Search
USPC .......................................................... 716/119
See application file for complete search history.

(56) References Cited

U.S. PATENT DOCUMENTS

| | | | |
|---|---|---|---|
| 2003/0045051 A1* | 3/2003 | Pohl | H01L 27/10861 257/E21.546 |
| 2003/0068860 A1* | 4/2003 | Rabkin | H01L 27/115 438/257 |
| 2006/0263989 A1* | 11/2006 | Suzuki | H01L 27/11573 257/314 |
| 2016/0147927 A1* | 5/2016 | Chiang | G06F 30/392 257/401 |
| 2017/0317063 A1* | 11/2017 | Chang | G06F 30/392 |
| 2020/0019670 A1* | 1/2020 | Chang | G06F 30/392 |
| 2020/0020699 A1* | 1/2020 | Fujiwara | G06F 30/392 |
| 2020/0074043 A1* | 3/2020 | Chang | G06F 30/398 |
| 2021/0064806 A1* | 3/2021 | Peng | G06F 30/394 |

* cited by examiner

*Primary Examiner* — Mohammed Alam
(74) *Attorney, Agent, or Firm* — Maschoff Brennan

(57) ABSTRACT

A device includes a first cell, a second cell, and first isolation portions. The second cell is adjacent the first cell. The first and second cells are arranged in a first direction, and the first cell includes first and second conductive structures. The first conductive structures extend in the first direction. Each of the first conductive structures has a first end facing the second cell. The second conductive structures extend in the first direction. The first and second conductive structures are alternately arranged in a second direction different from the first direction. The first isolation portions are respectively abutting the first ends of the first conductive structures. Two of the first isolation portions are misaligned with each other in the second direction.

20 Claims, 16 Drawing Sheets

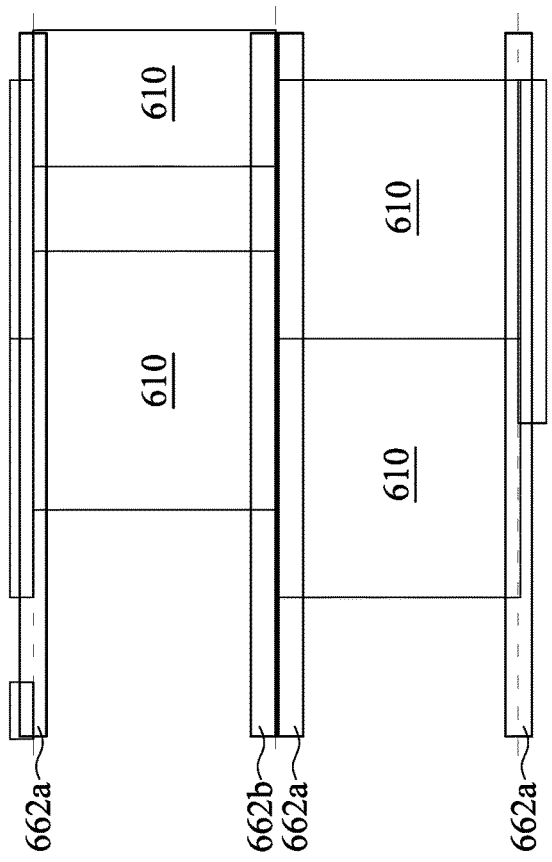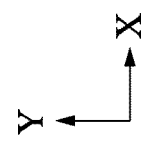
Fig. 9B
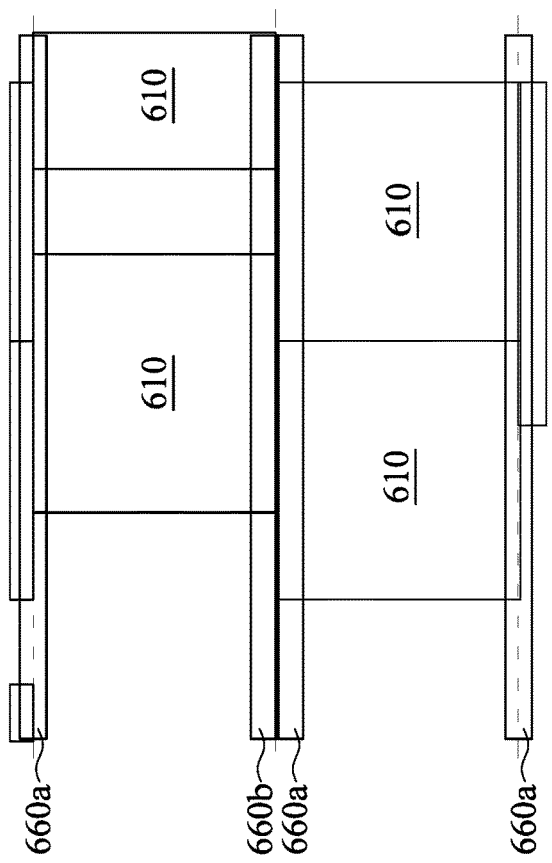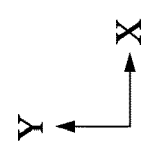
Fig. 9A

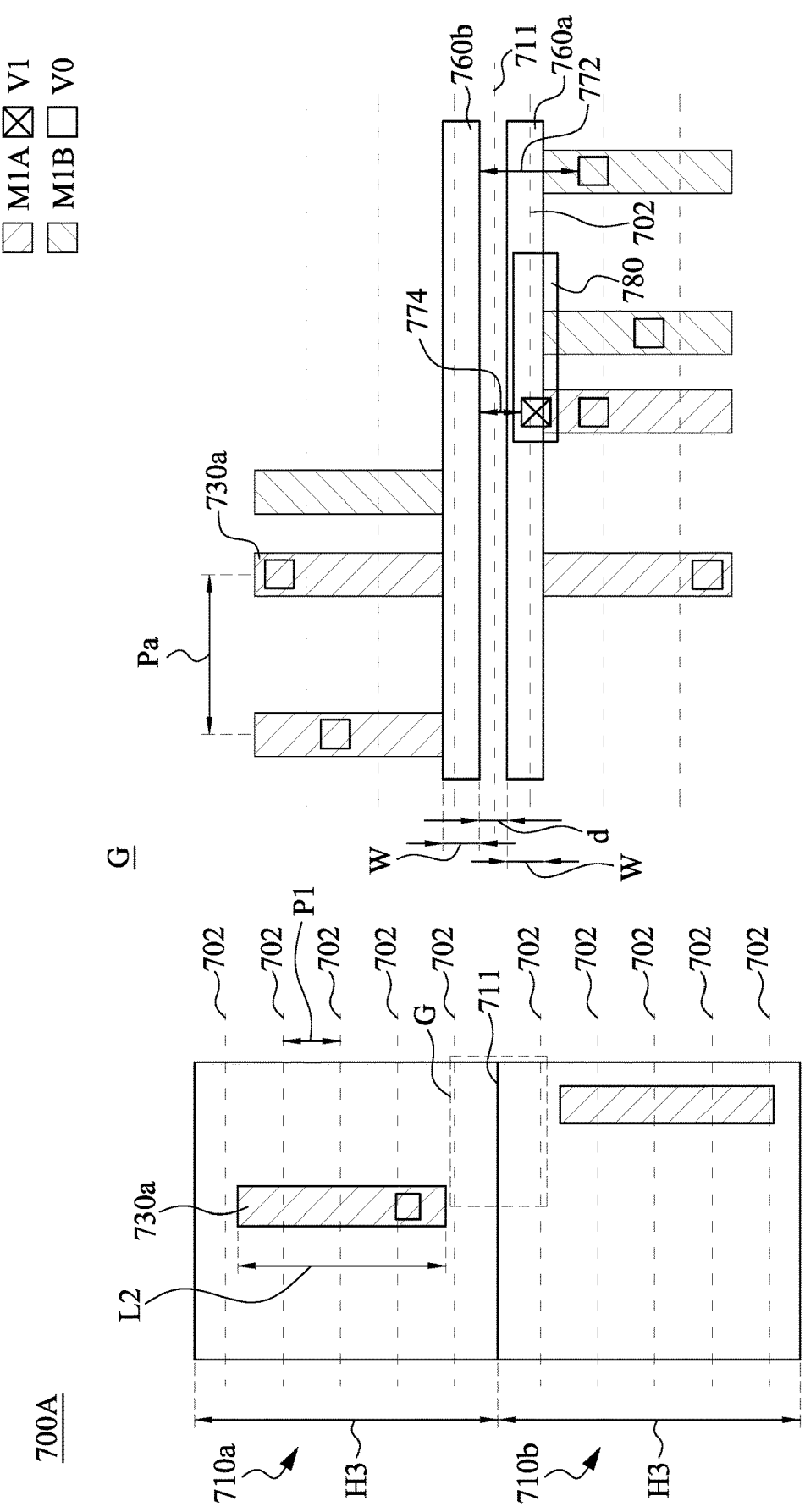

INTEGRATED CIRCUIT INCLUDING MISALIGNED ISOLATION PORTIONS

PRIORITY CLAIM AND CROSS-REFERENCE

This application is a Divisional application of the U.S. application Ser. No. 16/850,849, filed on Apr. 16, 2020, which claims priority to U.S. Provisional Application Ser. No. 62/894,320, filed Aug. 30, 2019, which is herein incorporated by reference.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistances of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A and 9B are top views of exemplary layout designs with a plurality of standard cells in accordance with some embodiments.

FIG. 10A is a diagram of an exemplary layout design in accordance with some embodiments.

FIG. 10B is an enlarged view of area in FIG. 10A.

DETAILED DESCRIPTION

Figure 1A:
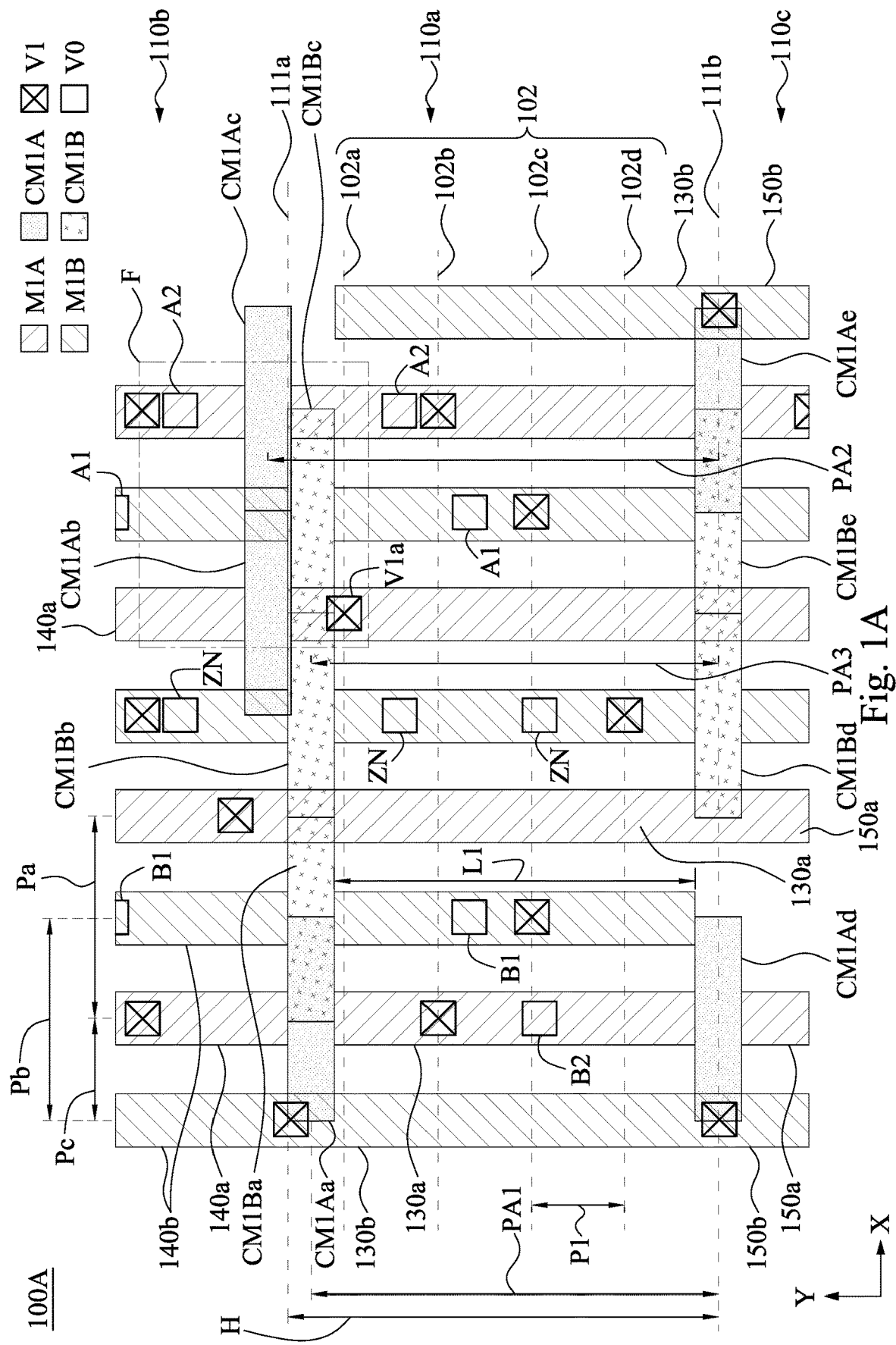
FIG. 1A is a diagram of a layout design in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

In the various embodiments of the present disclosure, double-patterning layout designs with offset cut patterns in a single mask are provided. The offset cut patterns in a single mask allow the increase of metal two (M2) pin access capability of a circuit layout, thereby increasing routing flexibility, as illustrated by the non-limiting examples provided below. A pin access point is a position where a conductive feature (e.g., a M2 line) can be connected to another conductive feature (e.g., a M1 line). The number of access points plays a role to determine the routing ability, such as routing density and routing flexibility.

Devices including cell structures therein are provided in accordance with various embodiments hereinafter. Some variations of some embodiments are discussed. Throughout various views and illustrative embodiments, like elements are designated with like reference numbers for ease of understanding.

FIG. 1A is a diagram of a layout design 100A in accordance with some embodiments. The layout design 100A is a layout diagram of an integrated circuit 100B of FIG. 1B, which is a diagram of a top view of an integrated circuit 100B in accordance with some embodiments. The layout design 100A is usable to manufacture an integrated circuit, such as the integrated circuit 100B of FIG. 1B. In some embodiments, the layout design 100A includes additional elements not shown in FIG. 1A. In addition to the layout design 100A, FIG. 1A depicts X-axis and Y-axis directions.

The layout design 100A includes a standard cell layout pattern 110a, and portions of standard cell layout patterns 110b and 110c. The standard cell layout pattern 110a is between the standard cell layout patterns 110b and 110c, and the standard cell layout pattern 110b, 110a, and 110c are arranged in the Y-axis direction. A cell boundary 111a is between the standard cell layout patterns 110a and 110b, and a cell boundary 111b is between the standard cell layout patterns 110a and 110c. The cell boundaries 111a and 111b define a cell region therebetween, and the standard cell layout pattern 110a is in the cell region. The standard cell layout patterns 110a, 110b, and 110c are useable to manufacture corresponding standard cells 110a', 110b', and 110c' of the integrated circuit 100B of FIG. 1B. In some embodiments, the term "standard cell" as discussed above is referred to as an electrical component configured to provide logic-based functionality, storage functionality, or the like.

In some embodiments, one or more of the standard cell layout patterns 110a, 110b, and 110c is a layout design of a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, one or more of standard cell layout patterns 110a, 110b, and 110c is a layout design of a memory cell. In some embodiments, a memory cell includes a static random access memory (SRAM), a dynamic RAM (DRAM), a resistive RAM (RRAM), a magnetoresistive RAM (MRAM) or read only memory (ROM). In some embodiments, one or more of standard cell layout patterns 110a, 110b, and 110c includes layout designs of one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drain. Examples of passive elements include, but are not limited to, capacitors, inductors, fuses, and resistors.

In some embodiments, the layout design 100A includes a set of gridlines 102, a set of first cut feature layout pattern CM1A, a set of second cut feature layout pattern CM1B, a set of first conductive feature layout patterns 130a, a set of second conductive feature layout patterns 130b, a set of first conductive feature layout patterns 140a, a set of second conductive feature layout patterns 140b, a set of first conductive feature layout patterns 150a, and a set of second conductive feature layout patterns 150b. For example, as shown in FIG. 1A, the CM1A portions correspond to the first cut feature layout patterns CM1Aa, CM1Ab, CM1Ac, CM1Ad, and CM1Ae, the CM1B portions correspond to the second cut feature layout pattern CM1Ba, CM1Bb, CM1Bc, CM1Bd, and CM1Be, the M1A portions correspond to the first conductive feature layout patterns 130a, 140a, and 150a, and the M1B portions correspond to the second conductive feature layout patterns 130b, 140b, and 150b. The standard cell layout patterns 110a includes the first and second conductive feature layout patterns 130a and 130b, the standard cell layout patterns 110b includes the first and second conductive feature layout patterns 140a and 140b, and the standard cell layout patterns 110c includes the first and second conductive feature layout patterns 150a and 150b.

Each of the gridlines 102 extends in the X-axis direction. The set of gridlines 102 includes at least gridline 102a, gridline 102b, gridline 102c, and/or gridline 102d. Each gridline of the set of gridlines 102 is separated from an adjacent gridline of the set of gridlines 102 in the Y-axis direction by a pitch P1. In some embodiments, each gridline 102a, 102b, 102c, 102d of the set of gridlines 102 defines regions where corresponding conductive feature layout patterns extending in the X-axis direction are positioned. In some embodiments, the set of gridlines 102 are also referred to as a set of routing tracks. In some embodiments, conductive feature layout patterns on the set of gridlines 102 correspond to metal two (M2) conductive feature layout patterns. The M2 conductive feature layout patterns are located on a second layout level. In some embodiments, the second layout level is an M2 layout level.

The sets of first and second conductive feature layout patterns 130a, 130b, 140a, 140b, 150a, and 150b extend in the Y-axis direction. The sets of first conductive feature layout patterns 130a, 140a, and 150a are to be formed on a same mask of a multiple mask set, and the sets of second conductive feature layout patterns 130b, 140b, and 150b are to be formed on a different mask of the multiple mask set. Therefore, the first and second conductive feature layout patterns 130a, 130b, 140a, 140b, 150a, and 150b are referred to as sub-patterns. Each of the sets of first and second conductive feature layout patterns 130a, 130b, 140a, 140b, 150a, and 150b includes at least one conductive feature layout pattern. The sets of first and second conductive feature layout patterns 130a, 130b, 140a, 140b, 150a, and 150b are located on a first layout level. In some embodiments, the first layout level is a metal one (M1) layout level. In some embodiments, the M1 layout level is below the M2 layout level. The sets of first and second conductive feature layout patterns 130a, 130b, 140a, 140b, 150a, and 150b are usable to manufacture a corresponding set of first and second conductive structures 130a', 130b', 140a', 140b', 150a', and 150b' (FIG. 1B) of the integrated circuit 100B.

In some embodiments, the first and second conductive feature layout patterns 130a or 130b crosses over at least the gridline 102a, 102b, 102c, or 102d. In some embodiments, the sets of first and second conductive feature layout patterns 130a and 130b crosses over other underlying layout patterns (not shown) of other layout levels (e.g., MD, M0 or the like) of the layout design 100A.

In some embodiments, each of the first conductive feature layout patterns 130a is separated from an adjacent first conductive feature layout pattern 130a in the X-axis direction by a pitch Pa, and each of the second conductive feature layout patterns 130b is separated from an adjacent second conductive feature layout pattern 130b in the X-axis direction by a pitch Pb. The pitch Pb may be substantially the same as the pitch Pa. In some embodiments, the pitch Pa and/or Pb is in a range of about 24 nm to about 60 nm for EUV masks. The first and second conductive feature layout patterns 130a and 130b are alternately arranged in the X-axis direction, such that the pitch Pc between adjacent first and second conductive feature layout patterns 130a and 130b is less than the pitch Pa (Pb). For example, the pitch Pc is about half the pitch Pa (Pb). In some embodiments, the pitch Pc is in a range of about 18 nm to about 30 nm. Other configurations or quantities of patterns in the sets of first and second conductive feature layout patterns 130a and 130b are within the scope of the present disclosure.

The set of first cut feature layout patterns CM1A extends in the X-axis direction. The set of first cut feature layout patterns CM1A includes at least the first cut feature layout patterns CM1Aa, CM1Ab, CM1Ac, CM1Ad, and CM1Ae. Each of a center of the first cut feature layout patterns CM1Aa, CM1Ab, CM1Ac, CM1Ad, and CM1Ae is separated from an adjacent first cut feature layout patterns in the X-axis direction by a distance substantially equal to n times the pitch Pa, where n is a positive integer. For example, the center of the first cut feature layout pattern CM1Aa is spaced apart from the center of the first cut feature layout pattern CM1Ab in the X-axis direction by about 2 times the pitch Pa, and the center of the first cut feature layout pattern CM1Aa is spaced apart from the center of the first cut feature layout pattern CM1Ac in the X-axis direction by about 3 times the pitch Pa. The set of first cut feature layout patterns CM1A is located on the first layout level. In some embodiments, the first cut feature layout patterns CM1Aa and CM1Ab are located on the cell boundary 111a but offset from each other in the Y-axis direction. That is, the first cut feature layout patterns CM1Aa and CM1Ab are misaligned. Similarly, the first cut feature layout patterns CM1Aa and CM1Ac are located on the cell boundary 111a but offset from each other in the Y-axis direction. Moreover, the first cut feature layout patterns CM1Ad and CM1Ae are located on the cell boundary 111b and aligned with each other.

The first cut feature layout pattern CM1Aa is separated from the first cut feature layout pattern CM1Ad by a pitch PA1 in the Y-axis direction, and the first cut feature layout pattern CM1Ac is separated from the first cut feature layout pattern CM1Ae by a pitch PA2 in the Y-axis direction. In some embodiments, the pitch PA2 is different from the pitch PA1 as shown in FIG. 1A. For example, the pitch PA2 is greater than the pitch PA1. For example, a difference between the pitches PA1 and PA2 is less than a width W (see FIG. 7) of the first cut feature layout pattern CM1Aa. That is, the first cut feature layout pattern CM1Ab is offset from the first cut feature layout pattern CM1Aa in the Y-axis direction by an offset distance (=PA2−PA1) less than the width W of the first cut feature layout pattern CM1Aa.

The set of second cut feature layout patterns CM1B extends in the X-axis direction. The set of second cut feature layout patterns CM1B includes at least the second cut feature layout patterns CM1Ba, CM1Bb, CM1Bc, CM1Bd, and CM1Be. The set of second cut feature layout patterns CM1B is located on the first layout level. In some embodiments, the second cut feature layout patterns CM1Ba, CM1Bb, and CM1Bc are located on the cell boundary 111a and aligned with each other. That is, the second cut feature layout patterns CM1Ba, CM1Bb, and CM1Bc are aligned along the X-axis direction. Moreover, the second cut feature layout patterns CM1Bd and CM1Be are located on the cell boundary 111b and aligned with each other.

The second cut feature layout patterns CM1Ba, CM1Bb, and CM1Bc may be substantially aligned with the first cut feature layout pattern CM1Aa. That is, the second cut feature layout patterns CM1Ba, CM1Bb, and CM1Bc may be offset from (misaligned with) the first cut feature layout patterns CM1Ab and CM1Ac in the Y-axis direction. In some embodiments, the second cut feature layout pattern CM1Bc overlaps with the first cut feature layout patterns CM1Ab and/or CM1Ac as shown in FIG. 1A. The second cut feature layout pattern CM1Bb is separated from the second cut feature layout pattern CM1Bd by a pitch PA3 in the Y-axis direction. In some embodiments, the pitch PA3 is different from the pitch PA2 but substantially the same as the pitch PA1.

The set of first cut feature layout patterns CM1A is to be formed on a same mask of a multiple mask set, and the set of second cut feature layout patterns CM1B is to be formed on a different mask of the multiple mask set. Therefore, the first and second cut feature layout patterns CM1A and CM1B are referred to as sub-patterns. In some embodiments, the first cut feature layout patterns CM1Aa, CM1Ab, CM1Ac, CM1Ad, and CM1Ae identify corresponding locations of corresponding first isolation portions CM1Aa', CM1Ab', CM1Ac', CM1Ad', and CM1Ae' of the first conductive structures 130a', 140a', and/or 150a' (see FIG. 1B) that are removed in a cut metal process. In some embodiments, the second cut feature layout patterns CM1Ba, CM1Bb, CM1Bc, CM1Bd, and CM1Be identify corresponding locations of corresponding second isolation portions CM1Ba', CM1Bb', CM1Bc', CM1Bd', and CM1Be' of the second conductive structures 130b', 140b', and/or 150b' (see FIG. 1B) that are removed in another cut metal process. For example, at least one of the first conductive structures 130a' has an end 132a' facing the standard cell 110b', and the first isolation portion CM1Aa' abuts the end 132a' of the first conductive structure 130a'.

Figure 1B:
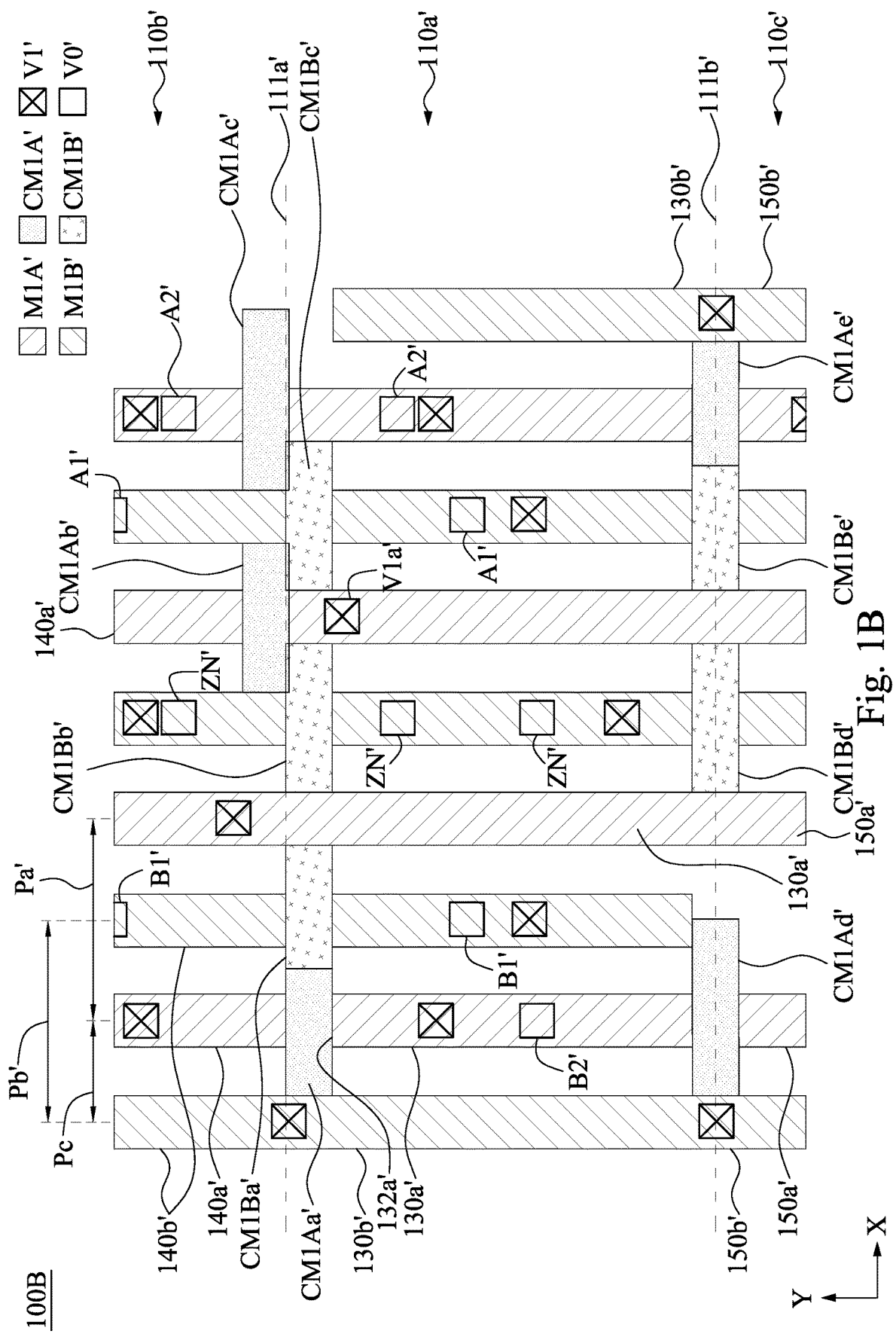
FIG. 1B is a diagram of a top view of an integrated circuit in accordance with some embodiments.

In some embodiments, the layout design 100A further includes metal zero via patterns A1, A2, B1, B2, and ZN and metal one via patterns V1a (only one labeled for clarity). For example, as shown in FIG. 1A, the V0 portions correspond to the metal zero via patterns A1, A2, B1, B2, and ZN, and the V1 portions correspond to the metal one via pattern V1a. The metal zero via patterns A1, A2, B1, B2, and ZN identify corresponding locations of corresponding metal zero vias A1', A2', B1', B2', and ZN' in FIG. 1B, and the metal one via patterns A1, A2, B1, B2, and ZN identify corresponding locations of corresponding metal one vias V1a'. For example, as shown in FIG. 1B, the V0' portions correspond to the metal zero vias A1', A2', B1', B2', and ZN', and the V1' portions correspond to the metal one via V1a'. Each of the metal zero vias A1', A2', B1', B2', and ZN' is configured to interconnect the first or second conductive structures 130a', 130b', 140a', 140b', 150a', or 150b' and an underlying structure (e.g., MD, M0 or the like), and each of the metal one vias V1a' is configured to interconnect the first or second conductive structures 130a', 130b', 140a', 140b', 150a', or 150b' and an M2 conductive structure.

Reference is made to FIG. 1B. In FIG. 1B, components that are the same or similar to those in one or more of FIGS. 1A, 2A-2C, and 5A-11 (shown below) are given the same or similar reference numbers, and detailed description thereof is thus omitted. The integrated circuit 100B is manufactured by the layout design 100A of FIG. 1A. Structural relationships including positions and alignment, as well as configurations of the integrated circuit 100B of FIG. 1B are similar to the corresponding structural relationships and corresponding configurations of the layout design 100A of FIG. 1A, and similar detailed description will not be described in FIGS. 1B, 2A-2C, and 5A-11 for brevity.

The integrated circuit 100B includes standard cells 110a', 110b', and 110c'. In some embodiments, one or more of standard cells 110a', 110b', and 110c' is a logic gate cell. In some embodiments, one or more of standard cells 110a', 110b', and 110c' is a memory cell. In some embodiments, one or more of standard cells 110a', 110b', and 110c' includes one or more active or passive elements.

In some embodiments, the integrated circuit 100B includes a set of first isolation portion CM1A', a set of second isolation portion CM1B', a set of first conductive structures 130a', a set of second conductive structures 130b', a set of first conductive structures 140a', a set of second conductive structures 140b', a set of first conductive structures 150a', and a set of second conductive structures 150b' (described below). For example, as shown in FIG. 1B, the CM1A' portions correspond to the first isolation portion CM1Aa', CM1Ab', CM1Ac', CM1Ad', and CM1Ae', the CM1B' portions correspond to the second isolation portion CM1Ba', CM1Bb', CM1Bc', CM1Bd', and CM1Be', the M1A' portions correspond to the first conductive structures 130a', 140a', and 150a', and the M1B' portions correspond to the second conductive structures 130b', 140b', and 150b'.

In some embodiments, the integrated circuit 100B further includes cell boundaries 111a' and 111b'. In some embodiments, the cell boundaries 111a' and 111b' do not overlap with gate structures of the standard cells 110a', 110b', and/or 110c'. The cell boundaries 111a' and 111b' extend in the X-axis direction while the gate structures of the standard cells 110a', 110b', and/or 110c' extend in the Y-axis direction.

Each of the sets of first and second conductive structures 130a' and 130b' includes a plurality of conductive structures. Each of the sets of first and second conductive structures 140a' and 140b' includes a plurality of conductive structures. Each of the sets of first and second conductive structures 150a' and 150b' includes a plurality of conductive structures. In some embodiments, the first and second conductive structures 130a', 130b', 140a', 140b', 150a', and 150b' are on the M1 layer of integrated circuit 100B.

Each of the first conductive structures 130a is separated from an adjacent first conductive structure 130a in the X-axis direction by a pitch Pa', and each of the second conductive structures 130b is separated from an adjacent second conductive structure 130b in the X-axis direction by a pitch Pb'. The pitch Pb' may be substantially the same as the pitch Pa'. In some embodiments, the pitch Pa' and/or Pb' is in a range of about 24 nm to about 60 nm for EUV masks. The first and second conductive structures 130a' and 130b' are alternately arranged in the X-axis direction, such that the pitch Pc' between adjacent first and second conductive structures 130a' and 130b' is less than the pitch Pa' (Pb'). For example, the pitch Pc' is about half the pitch Pa' (Pb'). In some embodiments, the pitch Pc' is in a range of about 18 nm to about 30 nm. Other configurations or quantities of patterns in the sets of first and second conductive structures 130a' and 130b' are within the scope of the present disclosure.

The first conductive structure 130a' is separated from the first conductive structure 140a' by the first isolation portion CM1Aa', CM1Ab', or CM1Ac'. In some embodiments, the first isolation portion CM1Aa' and CM1Ab' are on opposite sides of the cell boundary 111a'. The first conductive structure 130a' is separated from the first conductive structure 150a' by the first isolation portion CM1Ad' or CM1Ae'. The second conductive structure 130b' is separated from the second conductive structure 140b' by the second isolation portion CM1Ba', CM1Bb', or CM1Bc'. The second conductive structure 130b' is separated from the second conductive structure 150b' by the second isolation portion CM1Bd' or CM1Be'.

In FIGS. 1A and 1B, because the first and second cut feature layout patterns correspond to separate mask sets, the first cut feature layout patterns CM1A define the first isolation portions CM1A' of the first conductive structures M1A' (e.g., 130a', 140a', and/or 150a') independent of the second isolation portions CM1B' of the second conductive structures M1B', and the second cut feature layout patterns CM1B define the second isolation portions CM1B' of the second conductive structures M1B' (e.g., 130b', 140b', and/or 150b') independent of the first isolation portions CM1A' of the first conductive structures M1A'.

In some embodiments, at least one structure of the sets of first and second conductive structures 130a', 130b', 140a', 140b', 150a', and 150b' includes one or more layers of metal materials, such as Al, Cu, W, Ti, Ta, TiN, TaN, NiSi, CoSi, other suitable conductive materials, or combinations thereof. In some embodiments, at least one structure of the sets of first and second isolation portions CM1A' and CM1B' includes one or more layers of dielectric materials, such as silicon oxide, silicon nitride, silicon oxynitride, high-k dielectric materials, other suitable dielectric materials, or combinations thereof. In some embodiments, at least one vias A1', A2', B1', B2', ZN', and/or V1a' includes one or more layers of metal materials, such as Al, Cu, W, Ti, Ta, TiN, TaN, NiSi, CoSi, other suitable conductive materials, or combinations thereof.

Figure 2C:
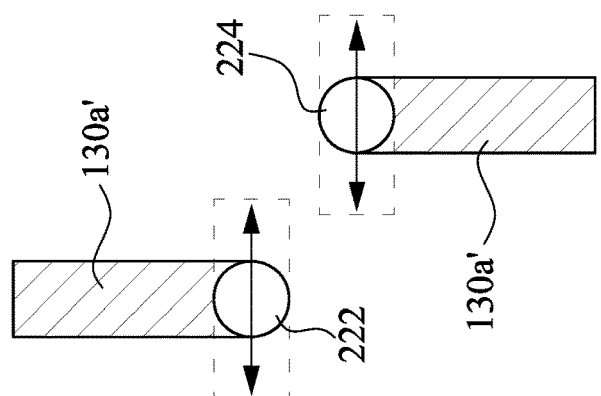
FIG. 2C illustrates a top view of an exemplary second patterning method in accordance with various embodiments of the present disclosure.
Figure 2B:
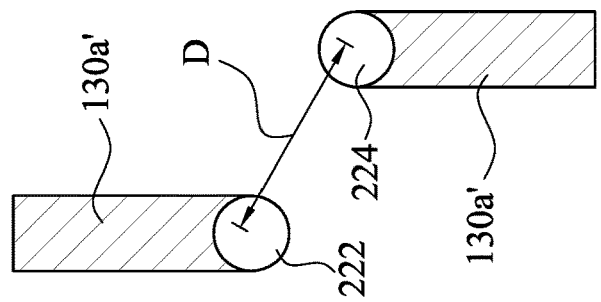
FIG. 2B illustrates a top view of an exemplary first patterning method in accordance with various embodiments of the present disclosure.
Figure 2A:
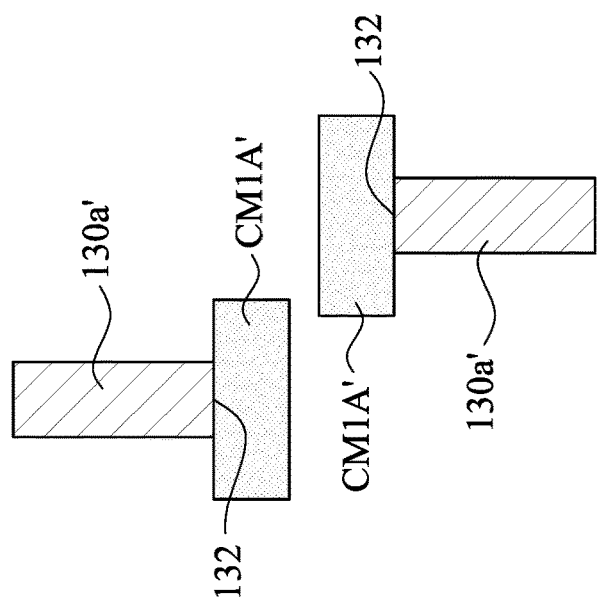
FIG. 2A illustrates a top view of an exemplary metal one pattern having first conductive structures and first isolation portions in accordance with various embodiments of the present disclosure.

FIG. 2A illustrates a top view of an exemplary M1 pattern 210 having first conductive structures 130a' and first isolation portions CM1A' in accordance with various embodiments of the present disclosure. The number of routing access points increases, the closer the first isolation portions CM1A' are to each other without touching, as touching of these conductive structures can result in an electrical short. FIG. 2B illustrates a top view of an exemplary first patterning method 220 in accordance with various embodiments of the present disclosure. In some embodiments, the first patterning method is a square hole push. In other words, a number of holes (or circles) are generated at one end of each of the first conductive structures 130a' (e.g., holes 222, 224, respectively) using an ultraviolet (UV) mask or extreme ultraviolet (EUV) lithography. The pitch D (e.g., center-to-center spacing between holes 222, 224) may be minimized to increase the number of routing access points of the integrated circuit 100B (see FIG. 1B). In some embodiments, a minimized pitch D may be between about 35 nm to about 45 nm. The pitch D may be dictated by the type of mask used during etching and/or etching design rules. FIG. 2C illustrates a top view of an exemplary second patterning method 230 in accordance with various embodiments of the present disclosure. In some embodiments, the second patterning method is directional or lateral etching. Lateral etching is performed on each side of the holes 222, 224 to increase the hole size laterally (e.g., the X-axis direction shown in FIG. 1B and illustrated as horizontally in FIG. 2C). The combination of square push hole etching in FIG. 2B and directional or lateral etching in FIG. 2C achieves the M1 pattern 210 illustrated in FIG. 2A. It is noted that the processes shown in FIGS. 2A-2C can be applied to the second conductive structures 130b' and second isolation portions CM1B' shown in FIG. 1B.

In FIG. 1A, the first cut feature layout patterns CM1A can be offset from each other, such that the M2 pin access capability on the cell boundary can be increased. For example, since the first cut feature layout pattern CM1Ab is offset from the first cut feature layout pattern CM1Aa, an additional metal one via pattern V1a can be put on the gridline 102a to increase the M2 pin access point. For example, the number of pin access points of the layout design 100A is increased about 2% utilization compared with a layout design without the offset cut feature layout patterns. Furthermore, multi-location of the first cut feature layout patterns CM1A can be used, and the space between two locations in the Y-axis direction can be very small even overlap. In FIG. 1B, since the first isolation portions CM1A' are formed by directional etching, the adjacent first isolation portions CM1A' are not merged, and corner rounding issues at the edges (e.g., the edge 132 shown in FIG. 2A) of the first conductive structures 130a' can be improved or avoided. In some other embodiments, the configurations of the second cut feature layout patterns CM1B, the second isolation portions CM1B', and/or the second conductive structures 130b' (e.g., FIG. 8) are similar to the configurations of the first cut feature layout patterns CM1A, the first isolation portions CM1A', and/or the first conductive structures 130a', and, therefore, a description in this regard will not be repeated hereinafter.

Figure 3:
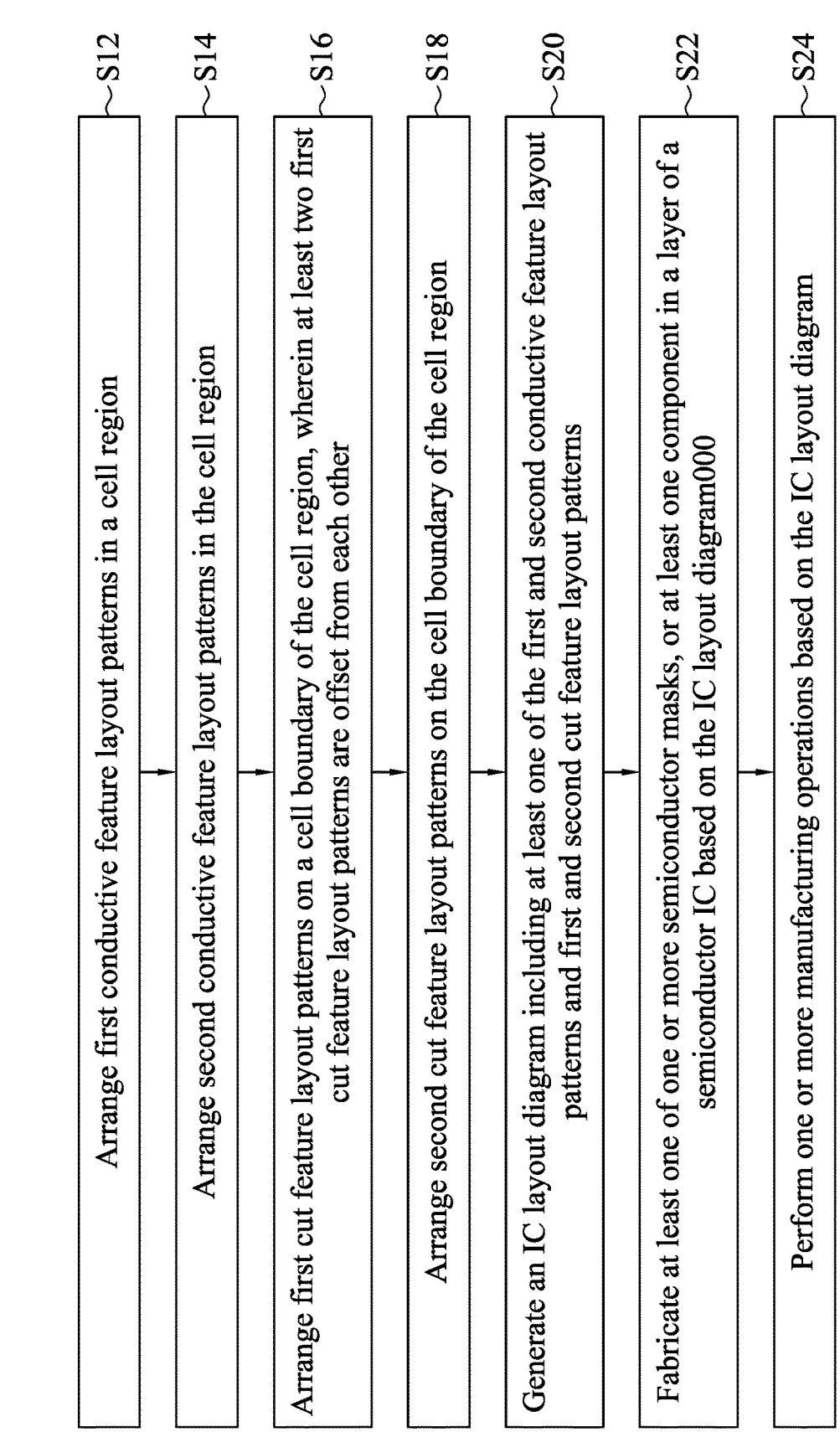
FIG. 3 is a flowchart of a method of generating an IC layout diagram, in accordance with some embodiments of the present disclosure.

FIG. 3 is a flowchart of a method M10 of generating an IC layout diagram, in accordance with some embodiments of the present disclosure. In some embodiments, generating an IC layout diagram includes generating one of layout diagrams 100A, 300A, 500A, 700A, and 800A, corresponding to an IC structure, e.g., one of layout structures 100B discussed above with respect to FIGS. 1A and 1B and FIGS. 5A-5C, 7-8, and 10A-11 discussed below, manufactured based on the generated IC layout diagram. In some embodiments, generating the IC layout diagram is part of operating an IC manufacturing system as part of manufacturing an IC device, e.g., a memory circuit, logic device, processing device, signal processing circuit, or the like.

In some embodiments, some or all of the method M10 is executed by a processor of a computer. In some embodiments, some or all of the method M10 is executed by a processor 1202 of an IC device design system 1200, discussed below with respect to FIG. 12. Some or all of the operations of the method M10 are capable of being performed as part of a design procedure performed in a design house, e.g., design house 1320 discussed below with respect to FIG. 13.

In some embodiments, the operations of the method M10 are performed in the order depicted in FIG. 3. In some embodiments, the operations of the method M10 are performed simultaneously and/or in an order other than the order depicted in FIG. 3. In some embodiments, one or more operations are performed before, between, during, and/or after performing one or more operations of the method M10.

At operation S12, first conductive feature layout patterns are arranged in a cell region. In some embodiments, arranging the first conductive feature layout patterns includes arranging the first conductive feature layout patterns corresponding to the first conductive feature layout patterns 130a, 140a, and/or 150a in a region of the standard cell layout pattern 110a, 110b, and/or 110c discussed above with respect to FIG. 1A. In some embodiments, the first conductive feature layout patterns have a pitch in a range of about 24 nm to about 60 nm for EUV masks.

At operation S14, second conductive feature layout patterns are arranged in the cell region. In some embodiments, arranging the second conductive feature layout patterns includes arranging the second conductive feature layout patterns corresponding to the second conductive feature layout patterns 130b, 140b, and/or 150b discussed above with respect to FIG. 1A. In some embodiments, the second conductive feature layout patterns have a pitch in a range of about 24 nm to about 60 nm for EUV masks. In some embodiments, the first and second conductive feature layout patterns are alternately arranged, such that a pitch between adjacent first and second conductive feature layout patterns is in a range of about 18 nm to about 30 nm.

At operation S16, first cut feature layout patterns are arranged on a cell boundary of the cell region, wherein at least two first cut feature layout patterns are offset from each other. In some embodiments, arranging the first cut feature layout patterns includes arranging the first cut feature layout patterns corresponding to the first cut feature layout patterns CM1A on the cell boundary 111a discussed above with respect to FIG. 1A.

At operation S18, second cut feature layout patterns are arranged on the cell boundary of the cell region. In some embodiments, arranging the second cut feature layout patterns includes arranging the second cut feature layout patterns corresponding to the second cut feature layout patterns CM1B on the cell boundary 111a discussed above with respect to FIG. 1A. In some embodiments, at least two of the second cut feature layout patterns may be offset from each other.

At operation S20, in some embodiments, an IC layout diagram is generated. The IC layout diagram includes the first and second conductive feature layout patterns and the first and second cut feature layout patterns arranged as discussed above with respect to operations S12-S18.

In some embodiment, generating the IC layout diagram includes storing the IC layout diagram in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 1214 of the IC device design system 2700, discussed below with respect to FIG. 12.

At operation S22, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 13.

At operation S24, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 13.

By executing some or all of the operations of method M10, an IC layout diagram and corresponding IC device, e.g., as discussed above with respect to FIGS. 1A-1B, are generated in which the various embodiments include stacked transistors with source/drains offset along a gate direction, thereby improving access to the source/drains and increasing routing flexibility compared to approaches in which source/drains are not offset along a gate direction.

Figure 4:
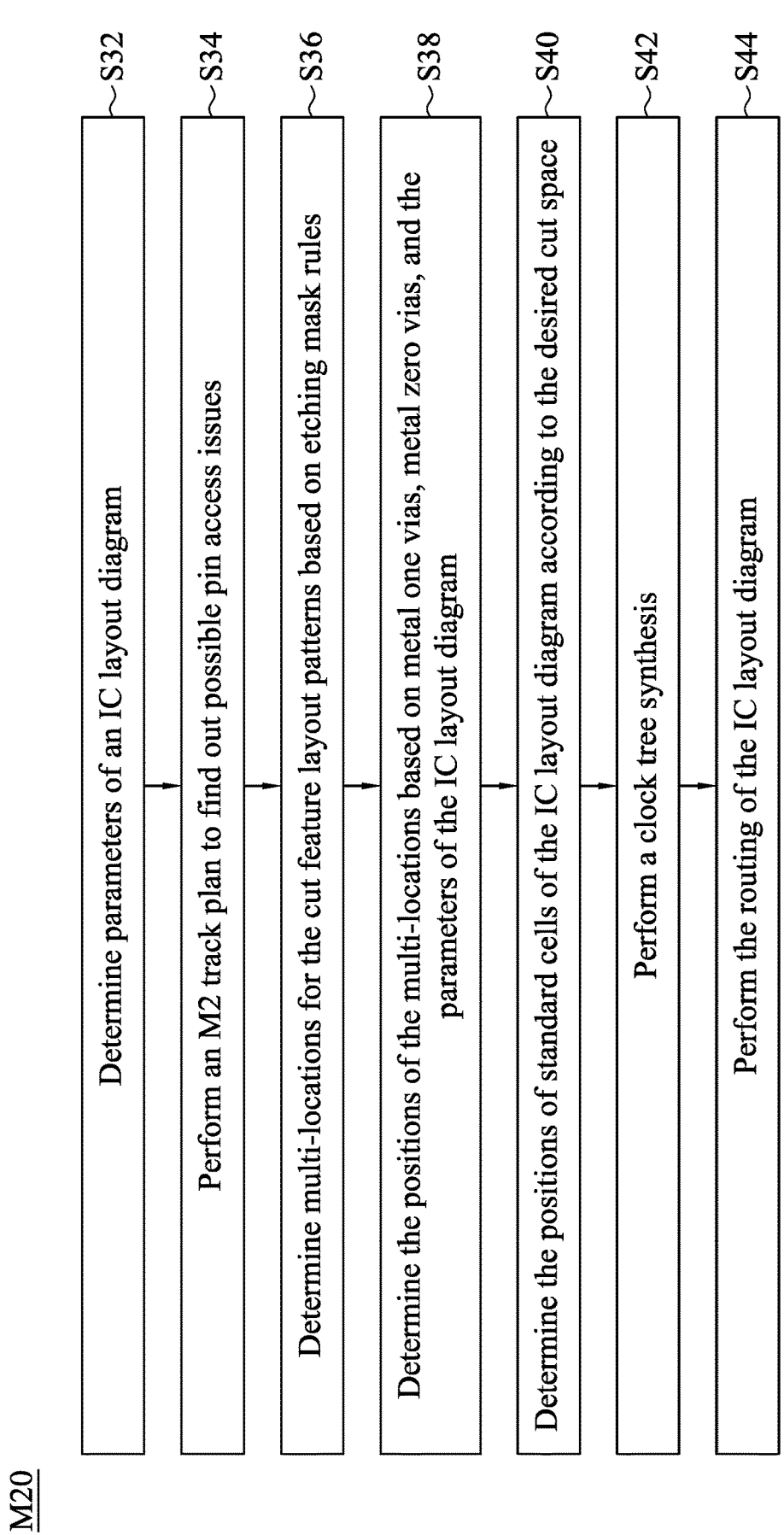
FIG. 4 is a flowchart of a method M20 of designing an IC layout diagram, in accordance with some embodiments of the present disclosure.

FIG. 4 is a flowchart of a method M20 of designing an IC layout diagram, in accordance with some embodiments of the present disclosure. In some embodiments, designing an IC layout diagram includes designing one of layout diagrams 100A, 300A, 500A, 700A, and 800A, corresponding to an IC structure, e.g., one of layout structures 100B discussed above with respect to FIGS. 1A and 1B and FIGS. 5A-5C, 7-8, and 10A-11 discussed below, manufactured based on the generated IC layout diagram. In some embodiments, designing the IC layout diagram is part of operating an IC manufacturing system as part of manufacturing an IC device, e.g., a memory circuit, logic device, processing device, signal processing circuit, or the like.

In some embodiments, some or all of the method M20 is executed by a processor of a computer. In some embodiments, some or all of the method M20 is executed by a processor 1202 of the IC device design system 2700, discussed below with respect to FIG. 12. Some or all of the operations of the method M20 are capable of being performed as part of a design procedure performed in a design house, e.g., the design house 1320 discussed below with respect to FIG. 13.

In some embodiments, the operations of the method M20 are performed in the order depicted in FIG. 4. In some embodiments, the operations of the method M20 are performed simultaneously and/or in an order other than the order depicted in FIG. 4. In some embodiments, one or more operations are performed before, between, during, and/or after performing one or more operations of the method M20.

Figure 5A:
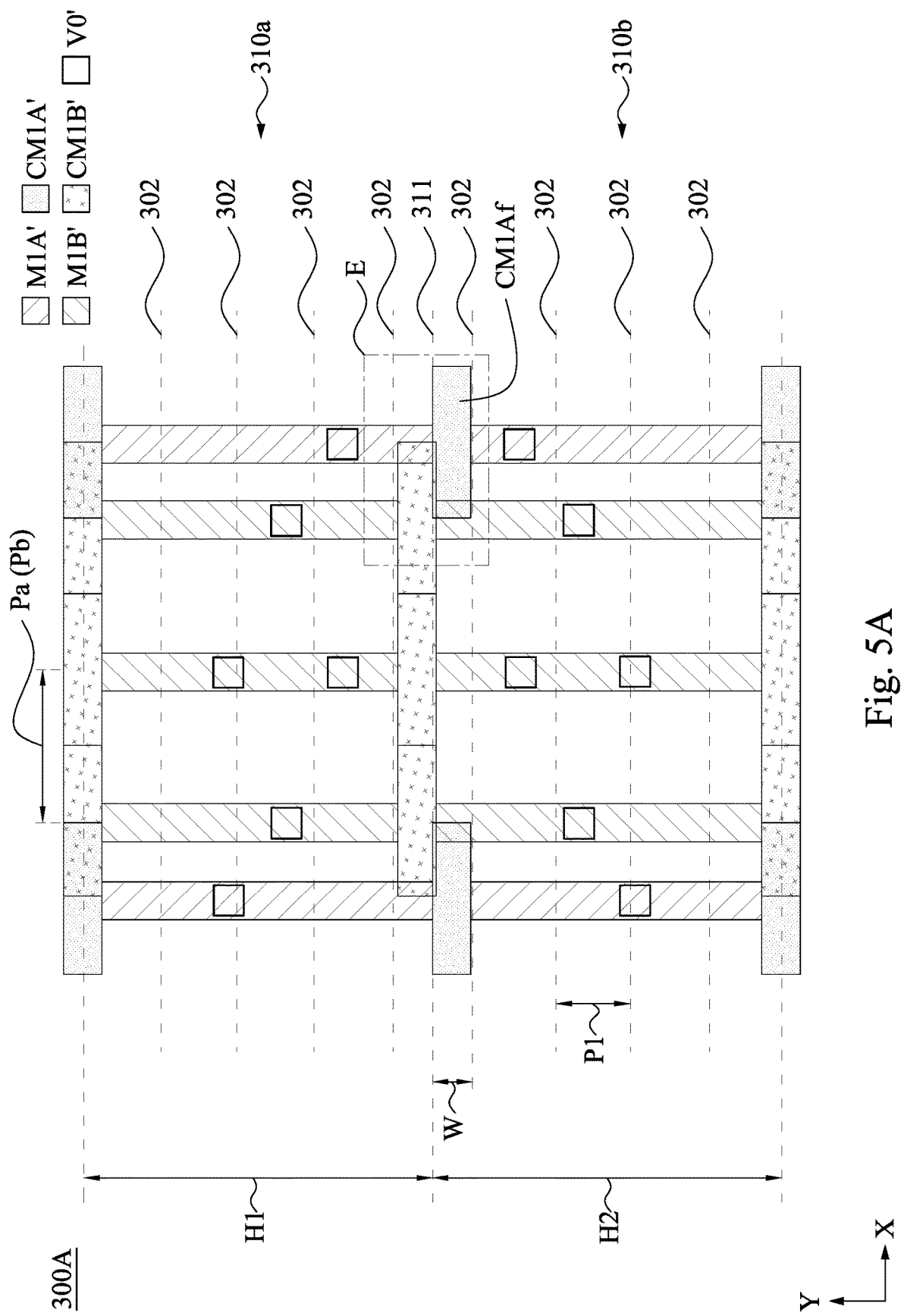
FIG. 5A is a diagram of a layout design in accordance with some embodiments.

FIG. 5A is a diagram of a layout design 300A, in accordance with some embodiments. The method M20 of FIG. 4 can be used to design the layout design 300A in FIG. 5A. In FIG. 5A, the layout design 300A includes standard cells 310a and 310b adjacent to each other. A cell boundary 311 is between the standard cells 310a and 310b.

At operation S32 of the method M20 in FIG. 4, parameters of an IC layout diagram are determined. In FIG. 5A, the parameters include a cell height H1 of the standard cell 310a and a cell height H2 of the standard cell 310b, metal pitches (e.g., M1 pitches Pa, and/or M2 pitch P1 shown in FIG. 5A), and/or the width W of first and/or second cut feature layout patterns (e.g., the first cut feature layout pattern CM1Af).

At operation S34 of the method M20 in FIG. 4, M2 track plan is performed to find out possible pin access issues. In this operation, the positions of the M2 conductive feature layout patterns (i.e., M2 routing tracks) are determined, and the locations of the pin access of the M2 conductive feature layout patterns are also designed. The M2 conductive feature layout patterns are located on gridlines 302, and the pin access location is a position that a metal one via pattern landed on a first conductive feature layout pattern (i.e., M1 conductive feature layout pattern).

In FIG. 5A, a possible pin access issue may be occurred in the area E, which is at the cell boundary 311 of the standard cells 310a and 310b. The occurrence of the possible pin access issue may be because the pre-determined location of a cut feature layout pattern (e.g., the cut feature layout pattern CM1Af) overlaps the pre-determined location of a metal one via pattern, such that the metal one via pattern can not be landed on the pre-determined location. If the metal one via pattern is landed on other positions, the chip area of the layout design 300A may be increased. To solve this issue, the cut feature layout pattern CM1Af may be offset from the pre-determined location in the Y-axis direction, and the metal one via pattern can be landed on its pre-determined location.

Figure 5B:
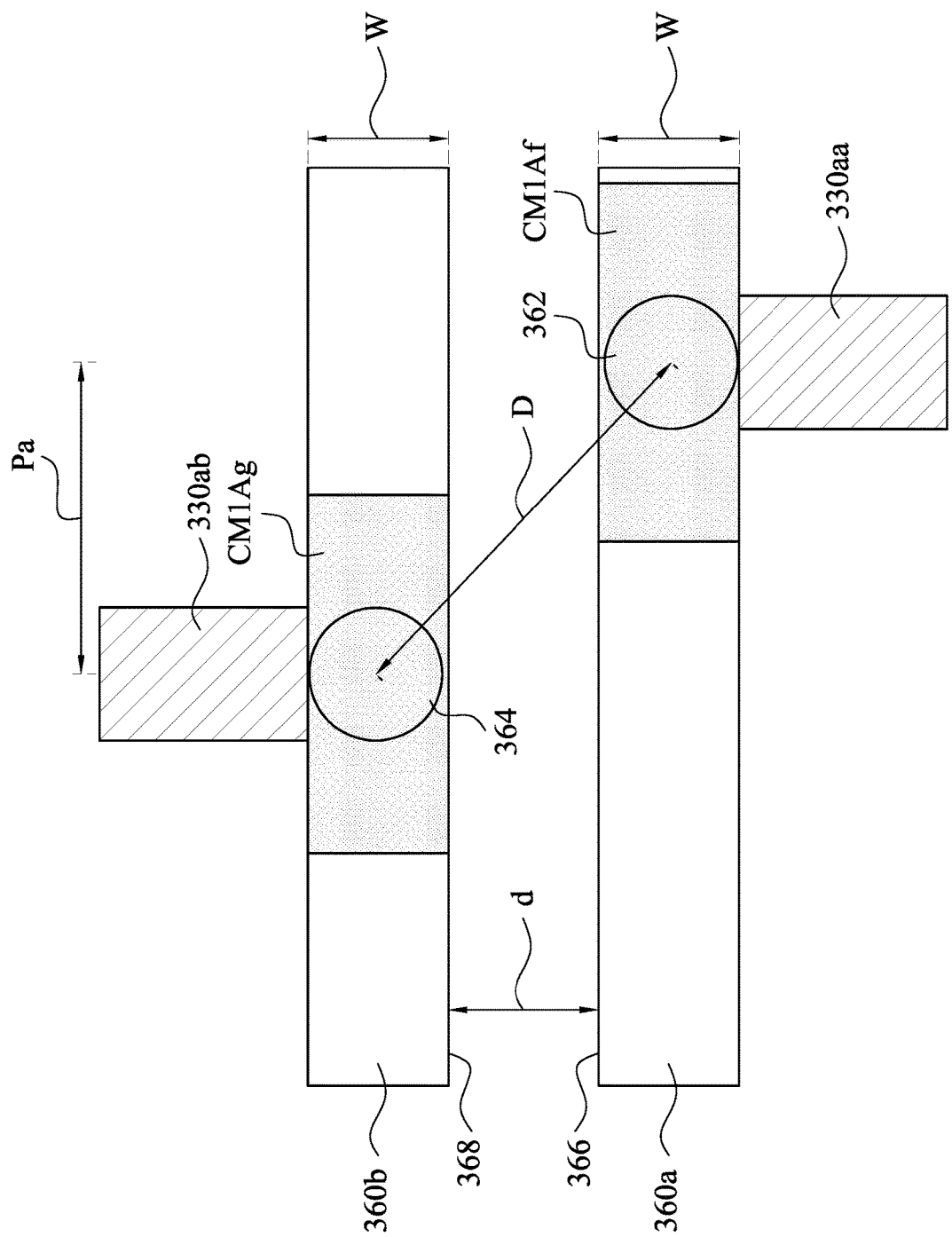
FIG. 5B is a top view of exemplary desired multi-locations of the cut feature layout patterns in accordance with various embodiments of the present disclosure.

At operation S36 of the method M20 in FIG. 4, multi-locations for the cut feature layout patterns are determined based on etching mask rules. Specifically, this operation checks if the cut feature layout pattern can be shifted (offset) in the Y-axis direction under the etching mask rules. Reference is made to FIG. 5B, which is a top view of exemplary desired multi-locations of the cut feature layout patterns in accordance with various embodiments of the present disclosure. In FIG. 5B, assuming that the cut feature layout patterns have two desired locations 360a and 360b, i.e., a cut feature layout pattern can be positioned on either the desired location 360a or 360b. The desired location 360a is the predetermined location, and the desired location 360b is a new location offset from the desired location 360a. For example, as shown in FIG. 5B, a cut feature layout pattern CM1Af is positioned on the desired location 360a, while another cut feature layout pattern CM1Ag is positioned on the desired location 360b. The cut feature layout pattern CM1Af is at an end of a conductive feature layout pattern 330aa, and the cut feature layout pattern CM1Ag is at an end of another conductive feature layout pattern 330ab adjacent to the conductive feature layout pattern 330aa. The conductive feature layout pattern 330aa and 330ab have a pitch Pa.

According to the processes shown in FIG. 2B, to form the isolation portions corresponding to the cut feature layout patterns CM1Af and CM1Ag, two holes 362 and 364 are respectively formed on the desired locations 360a and 360b. A pitch D is formed between the two holes 362 and 364 such that the holes 362 and 364 are not merged together. In some embodiments, the pitch D is about 35 nm to about 45 nm, or about 39 nm to about 42 nm for EUV masks. Since the pitch Pa and the widths W of the cut feature layout patterns CM1Af and CM1Ag are determined in operation S32, and the pitch D is determined by the (EUV) etching limitation, a desired cut space d between the two desired locations 360a and 360b can be determined by the following equation:

$$D \leq \sqrt{(W+d)^2 + Pa^2} \quad (1)$$

where the desired cut space d is a distance between the desired locations 360a and 360b. Specifically, the desired cut space d is defined by a top edge 366 of the desired location 360a and a bottom edge 368 of the desired location 360b. If the desired cut space d is positive, the desired locations 360a and 360b are spaced from each other; if the desired cut space d is negative, the desired locations 360a and 360b overlap with each other. If the equation (1) is satisfied, the cut feature layout patterns can be offset from the pre-determined location.

Figure 6:
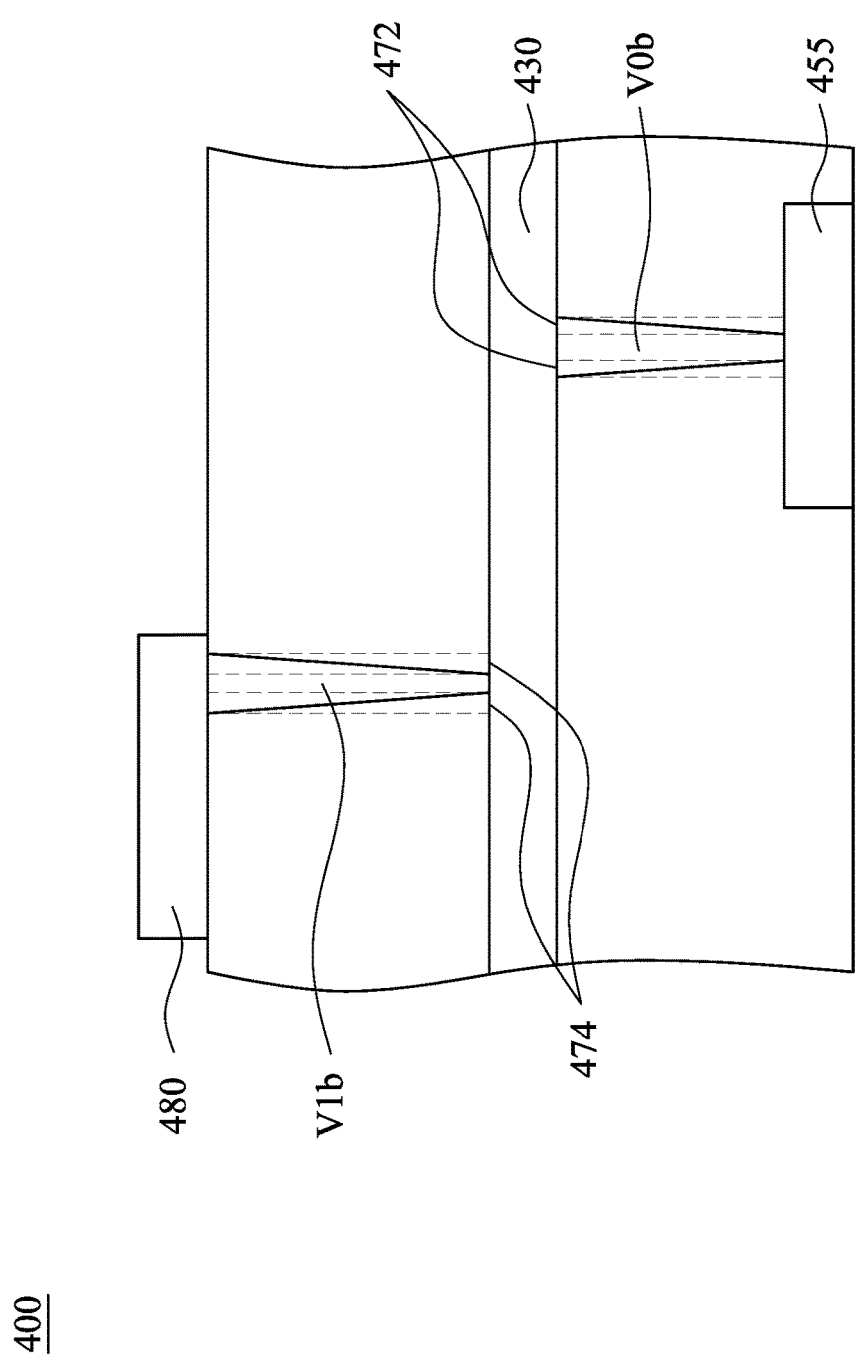
FIG. 6 is a cross-sectional view of an exemplary semiconductor structure in accordance with various embodiments of the present disclosure.

At operation S38 of the method M20 in FIG. 4, the positions of the multi-locations are determined based on metal one vias, metal zero vias, and the parameters of the IC layout diagram. Specifically, this operation determines the positions of the multi-locations under the existence of the metal one vias and metal zero vias. Reference is made to FIG. 6, which is a cross-sectional view of an exemplary semiconductor structure 400 in accordance with various embodiments of the present disclosure. In FIG. 6, the semiconductor structure includes an M1 conductive structure 430, a metal zero via V0b, and a metal one via V1b. The metal zero via V0b is under the M1 conductive structure 430, and the metal one via V1b is above the M1 conductive structure 430. The metal zero via V0b is configured to interconnect the M1 conductive structure 430 and a structure 455 underlying the M1 conductive structure 430 (such as MD, M0 or the like), and the metal one via V1b is configured to interconnect the M1 conductive structure 430 and an M2 conductive structure 480. In some embodiments, the vias V1b and V0b are both tapered downwardly due to etching processes. In order to ensure that there is enough etching space on the top side, a via enclosure 472 is defined on either side of the metal zero via V0b. Also, in order to ensure that there is enough etching space on the bottom side, a via landing 474 is defined on either side of the metal one via V1b.

Figure 5C:
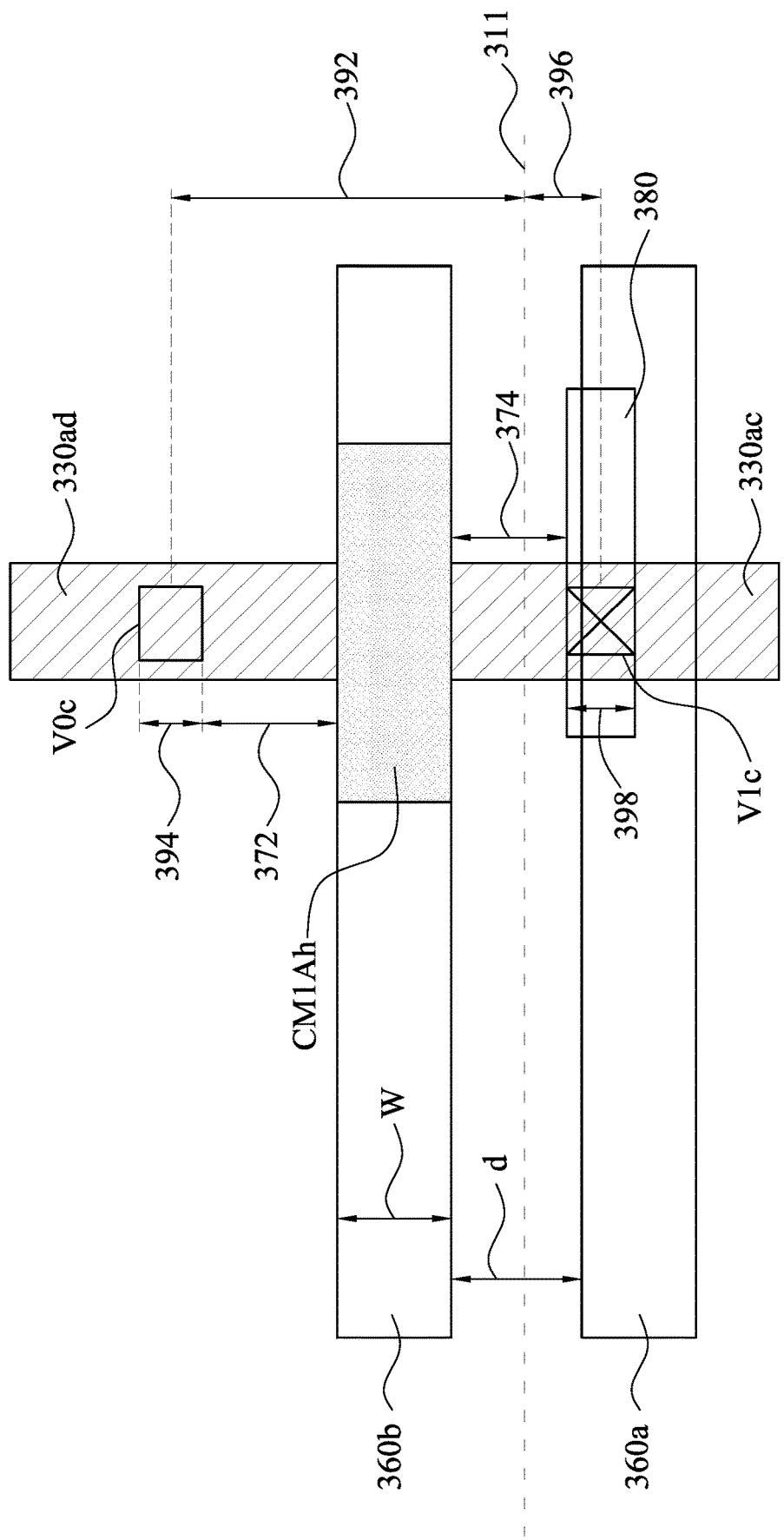
FIG. 5C is a top view of exemplary desired multi-locations of the cut feature layout pattern, an exemplary metal zero via pattern, an exemplary metal one via pattern, exemplary M1 conductive feature layout patterns, and an M2 conductive feature layout pattern in accordance with various embodiments of the present disclosure.

FIG. 5C is a top view of exemplary desired multi-locations of the cut feature layout pattern CM1Ah, an exemplary metal zero via pattern V0c, an exemplary metal one via pattern V1c, exemplary M1 conductive feature layout patterns 330ac and 330ad, and an M2 conductive feature layout pattern 380 in accordance with various embodiments of the present disclosure. The metal zero via pattern V0c is spaced apart from the cell boundary 311 by a distance 392, which is determined by a distance between the cell boundary 311 and a structure underlying the M1 conductive structure 330ad (such as MD, M0 or the like). The metal zero via pattern V0c has a size (length, width, or diameter) 394 and a via enclosure 372. The metal one via pattern V1c is spaced apart from the cell boundary 311 by a distance 396, which is determined by a distance between the cell boundary 311 and the M2 conductive feature layout pattern 380. The metal one via pattern V1c has a size (length, width, or diameter) 398 and a via landing 374. The sum of the distances 392 and 396 equals to the sum of half the size 394 of the via V0c, the via enclosure 372, the width W of the desired location 360b (i.e., the width of the cut feature layout pattern CM1Ah), the via landing 374, and half the size 398 of the via Vic. Given that the parameters 392, 396, 394, 398, and W are known, the sum of the via enclosure 372 and the via landing 374 is obtained from the aforementioned relationship. The desired cut space d can be obtained from the sum of the via enclosure 372 and the via landing 374, which will be described in FIG. 7. The desired cut space d is a parameter to adjust suitable locations of the desired locations 360a and 360b for the via enclosure 372 and the via landing 374.

After the desired cut space d is determined by the operation S38, this value is substituted into the equation (1) to check if the equation (1) is satisfied. If the equation (1) is satisfied, the rule is do-able. That is, two desired locations with a desired cut space d is determined in the layout design 300A.

At operation S40 of the method M20 in FIG. 4, the positions of standard cells of the IC layout diagram are determined according to the desired cut space obtained above. At operation S42 of the method M20 in FIG. 4, clock tree synthesis is performed after the operation S40. For example, in this operation, the positions of clock elements of the IC layout diagram are determined. At operation S44 of the method M20 in FIG. 4, the routing of the IC layout diagram is performed. For example, in this operation, the routing for interconnecting the standard cells and the clock elements are designed/determined. After the operation S44, the IC layout diagram is generated as shown in operation S20 of FIG. 3.

Figure 7:
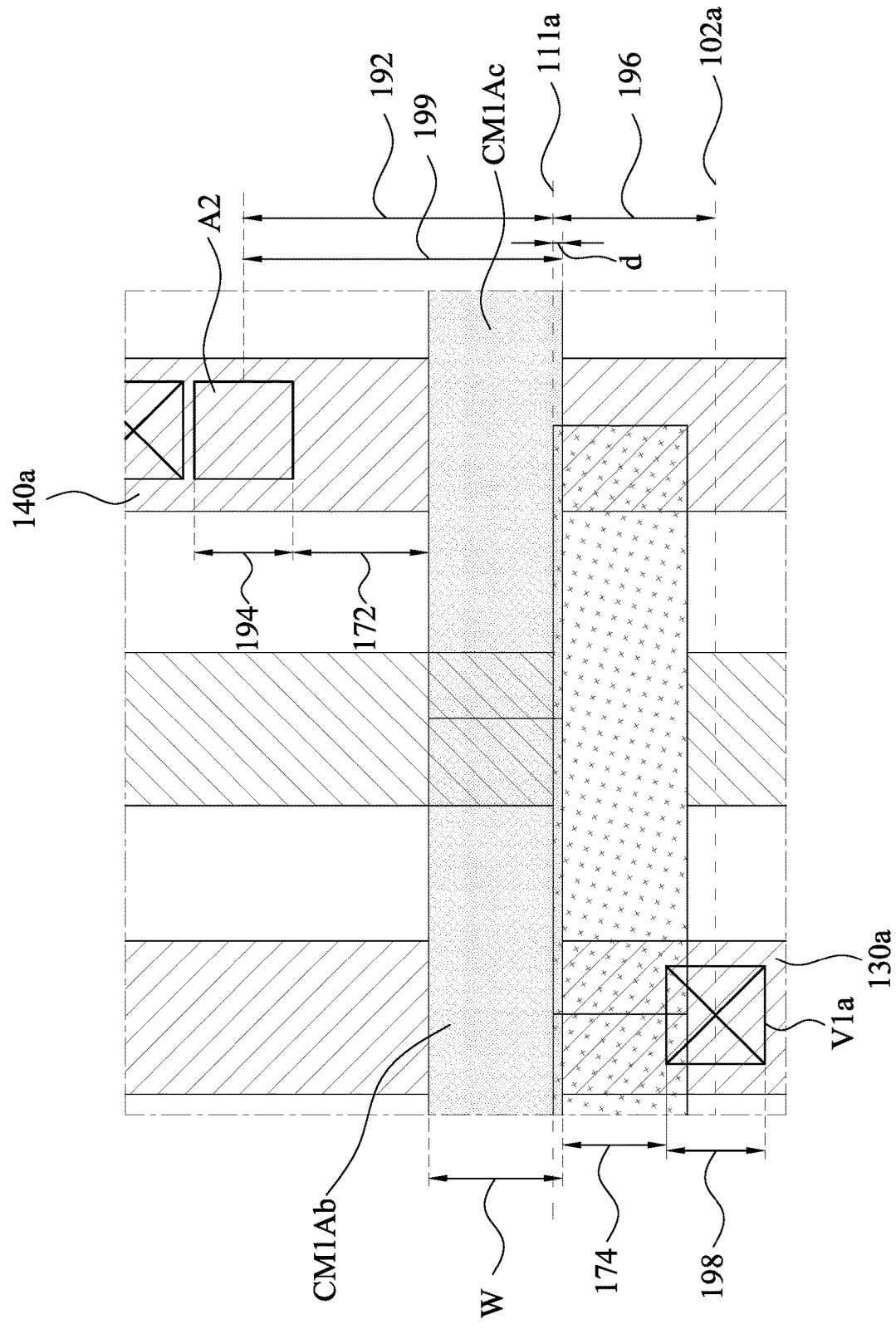
FIG. 7 is an enlarged view of area in FIG. 1A.

The method M20 in FIG. 4 can be applied to the layout diagram 100A in FIG. 1 to find out the desired cut space and the positions of the desired locations. Reference is made to FIGS. 1A and 7, wherein FIG. 7 is an enlarged view of area F in FIG. 1A. In some embodiments, a cell height H of the standard cell layout pattern 110a is about 110 nm, the pitch Pa (or Pb) is about 52 nm, the pitch P1 is about 24 nm, the width W of the first cut feature layout pattern CM1A is about 12 nm. In this case, the distance 192 between the metal zero via A2 and the cell boundary 111a is about 28 nm, the distance 196 between the metal one via V1a and the cell boundary 111a is about 13 nm, the size (length, width, or diameter) 194 of the metal zero via A2 is about 9 nm, the size (length, width, or diameter) 198 of the metal one via V1a is about 13 nm. According to the relationship shown in operation S38, a sum of the via enclosure 172 and the via landing 174 is about 18.5 nm. In some embodiments, the via enclosure 172 is set to be about 12 nm (such that the via landing 174 is about 6.5 nm), and the distance 199 is about 28.5 nm. Comparing the distance 199 (i.e., about 28.5 nm) with the distance 192 (i.e., about 28 nm), the resulting desired cut space d is about −0.5 nm. This value (−0.5 nm) is then substituted into the equation (1), and the equation (1) is satisfied.

The result means that the cut feature layout pattern CM1Ab can be shifted from a level aligned with the cut feature layout pattern CM1Aa in the Y-axis direction to the position shown in FIG. 1A, and the via V1a can be positioned on the gridline 102a with a sufficient via landing 174 (which is about 6.5 nm). Also, the first conductive feature layout pattern 130a has a minimum length L1 of about 83.5 nm, which is greater than a minimum length requirement of metal track.

Figure 8:
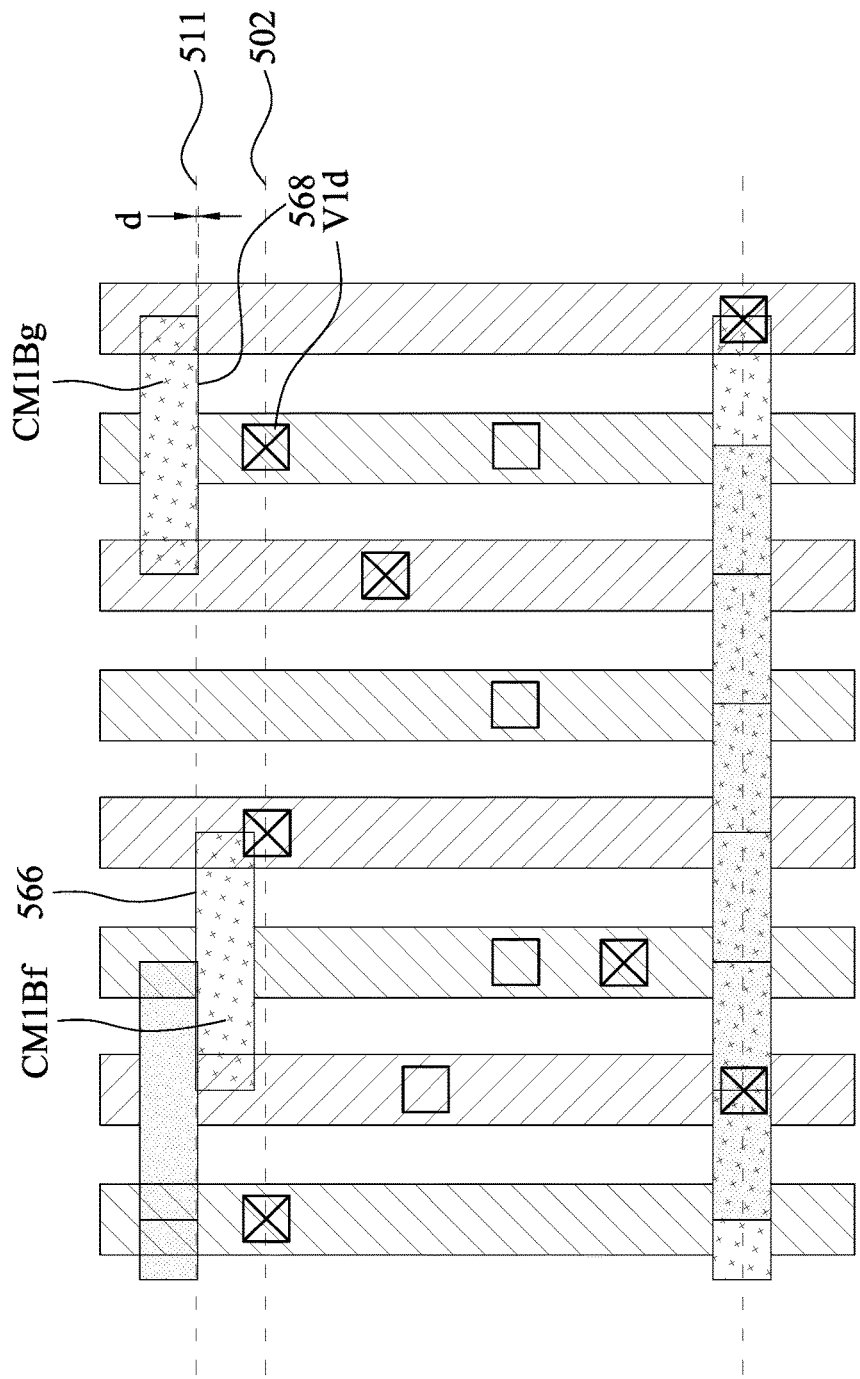
FIG. 8 is a diagram of a layout design in accordance with some embodiments.

FIG. 8 is a diagram of a layout design 500A, in accordance with some embodiments. The difference between the layout design 500A in FIG. 8 and the layout design 100A in FIG. 1A pertains to the positions of the first and second cut feature layout patterns. In FIG. 8, one of the second cut feature layout patterns (e.g., CM1Bg) is offset from another one of the second cut feature layout patterns (e.g., CM1Bf) in the Y-axis direction. A top edge 566 of the second cut feature layout pattern CM1Bf is substantially aligned with the cell boundary 511, and a bottom edge 568 and the cell boundary 511 form a desired cut spaced of about −0.5 nm. With such configuration, the metal one via pattern V1d can be positioned on a gridline 502 adjacent the cell boundary 511 to save the chip area. Other relevant structural details of the layout design 500A are similar to the layout design 100A, and, therefore, a description in this regard will not be repeated hereinafter.

FIGS. 9A and 9B are top views of exemplary layout designs with a plurality of standard cells 610 accordance with some embodiments. First cut feature layout patterns (e.g., the first cut feature layout patterns CM1A in FIG. 1A) can be positioned on the desired locations 660a and 660b in FIG. 9A, and second cut feature layout patterns (e.g., the second cut feature layout patterns CM1B in FIG. 8) can be positioned on the desired locations 662a and 662b in FIG. 9B. The desired location 660a overlaps with the desired location 660b by a desired cut space about −0.5 nm, and the desired location 662a overlaps with the desired location 662b by a desired cut space about −0.5 nm. The layout designs in FIGS. 9A and 9B can be used to design the positions of the first and second cut feature layout patterns CM1A and CM1B.

FIG. 10A is a diagram of an exemplary layout design 700A, in accordance with some embodiments, and FIG. 10B is an enlarged view of area G in FIG. 10A. In some embodiments, the layout design 700A includes additional elements not shown in FIGS. 10A and 10B. The layout design 700A has two standard cell layout patterns 710a and 710b, and a cell boundary 711 is between the standard cell layout patterns 710a and 710b. Each of the standard cell layout patterns 710a and 710b has a cell height H3 of about 120 nm. Gridlines 702 extend in the X-axis direction, and a pitch P1 of the gridlines 702 is about 24 nm. An M2 conductive feature layout pattern 780 can be positioned on the gridline 702. A pin access issue may be occurred in the area G, such that two desired locations 760a and 760b may be designed as shown in FIG. 10B. For example, each of the desired locations 760a and 760b has a width W of about 12 nm, and the pitch Pa is about 52 nm. After the calculation of operations S36 and S38 of method M20 in FIG. 4, the desired cut space d between the desired locations 760a and 760b is about 9 nm, such that the desired locations 760a and 760b are spaced apart from each other. Moreover, the via enclosure 772 is about 12 nm, the via landing 774 is about 10.5 nm, and the minimum length L2 of the first conductive feature layout pattern 730a is about 87 nm.

Figure 11:
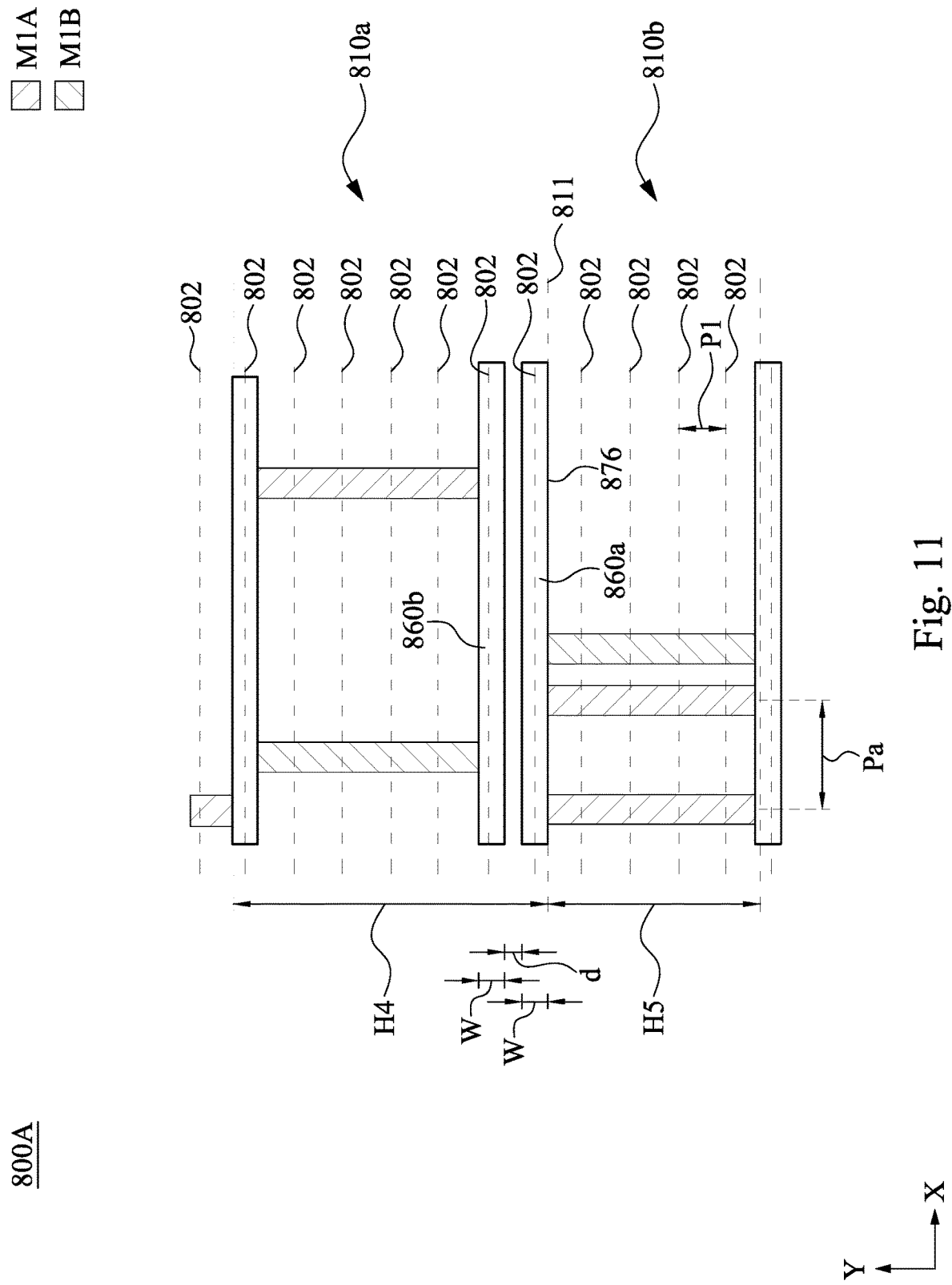
FIG. 11 is a diagram of an exemplary layout design in accordance with some embodiments.

FIG. 11 is a diagram of an exemplary layout design 800A, in accordance with some embodiments. In some embodiments, the layout design 800A includes additional elements not shown in FIG. 11. The layout design 800A has two standard cell layout patterns 810a and 810b, and a cell boundary 811 is between the standard cell layout patterns 810a and 810b. The standard cell layout pattern 810a has a cell height H4 of about 169 nm, and the standard cell layout pattern 810b has a cell height H5 of about 117 nm. Gridlines 802 extend in the X-axis direction, and a pitch P1 of the gridlines 802 is about 26 nm. A pin access issue may be occurred near the cell boundary 811, such that two desired locations 860a and 860b may be designed as shown in FIG. 11. For example, each of the desired locations 860a and 860b has a width W of about 14 nm, and the pitch Pa is about 60 nm. After the calculation of operations S36 and S38 of method M20 in FIG. 4, the desired cut space d between the desired locations 860a and 860b is about 10 nm, such that the desired locations 860a and 860b are spaced apart from each other. In some embodiments, one of edges of the desired locations 860a and 860b can be aligned to the cell boundary 811 to release the layout effort. For example, in FIG. 11, a bottom edge 876 of the desired location 860a is aligned with the cell boundary 811.

Figure 12:
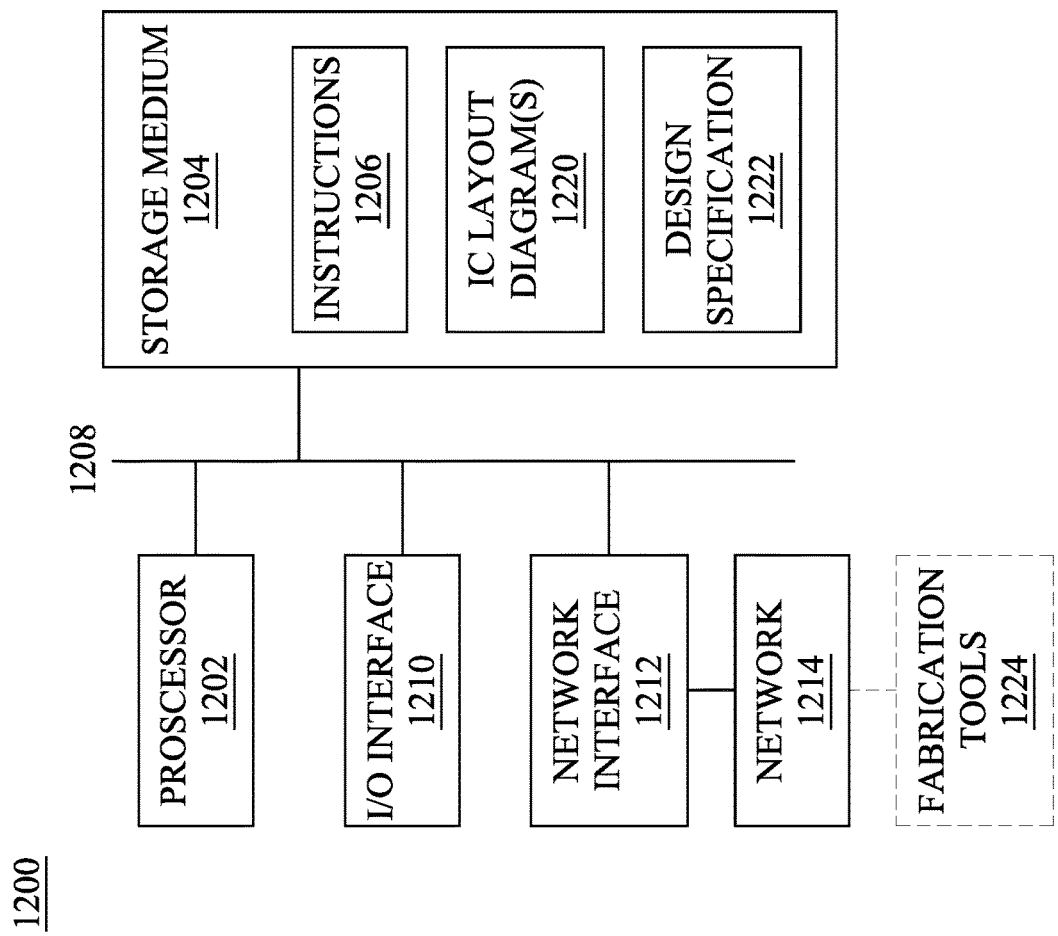
FIG. 12 is a block diagram of an IC device design system in accordance with some embodiments of the present disclosure.

FIG. 12 is a block diagram of an IC device design system 1200, in accordance with some embodiments of the present disclosure. One or more operations of the methods M10 and M20 as discussed above with respect to FIGS. 3 and 4, are implementable using the IC device design system 1200, in accordance with some embodiments.

In some embodiments, the IC device design system 1200 is a computing device including a hardware processor 1202 and a non-transitory computer-readable storage medium 1204. Non-transitory computer-readable storage medium 1204, amongst other things, is encoded with, i.e., stores, computer program codes, i.e., a set of executable instructions 1206. Execution of instructions 1206 by the hardware processor 1202 represents (at least in part) an IC device design system which implements a portion or all of, e.g., the method M10 and M20 as discussed above with respect to FIGS. 3 and 4 (hereinafter, the noted processes and/or methods).

The processor 1202 is electrically coupled to non-transitory computer-readable storage medium 1204 via a bus 1208. The processor 1202 is also electrically coupled to an I/O interface 1210 by a bus 1208. A network interface 1212 is also electrically connected to the processor 1202 via the bus 1208. A network interface 1212 is connected to a network 1214, so that the processor 1202 and non-transitory, computer-readable storage medium 1204 are capable of being connected to external elements via the network 1214. The processor 1202 is configured to execute the instructions 1206 encoded in non-transitory computer-readable storage medium 1204 in order to cause the IC device design system 1200 to be usable for performing a portion or all of the noted processes and/or methods. In one or more embodiments, the processor 1202 is a central processing unit (CPU), a multi-processor, a distributed processing system, an application specific IC (ASIC), and/or a suitable processing unit.

In one or more embodiments, the non-transitory computer-readable storage medium 1204 is an electronic, magnetic, optical, electromagnetic, infrared, and/or a semiconductor system (or apparatus or device). For example, the non-transitory computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the non-transitory computer-readable storage medium 1204 includes a compact disk-read only memory (CD-ROM), a compact disk-read/write (CD-R/W), and/or a digital video disc (DVD).

In one or more embodiments, the non-transitory computer-readable storage medium 1204 stores the instructions 1206 configured to cause the IC device design system 1200 to be usable for performing a portion or all of the noted processes and/or methods. In one or more embodiments, the non-transitory computer-readable storage medium 1204 also stores information which facilitates performing a portion or all of the noted processes and/or methods. In various embodiments, the non-transitory computer-readable storage medium 1204 stores one or a combination of at least one IC layout design diagram 1220 or at least one design specification 1222, each discussed above with respect to FIGS. 1A and 5A-11.

The IC device design system 1200 includes I/O interface 1210. The I/O interface 1210 is coupled to external circuitry. In various embodiments, the I/O interface 1210 includes one or a combination of a keyboard, keypad, mouse, trackball, trackpad, display, touchscreen, and/or cursor direction keys for communicating information and commands to and/or from the processor 1202.

The IC device design system 1200 also includes network interface 1212 coupled to the processor 1202. The network interface 1212 allows the IC device design system 1200 to communicate with the network 1214, to which one or more other computer systems are connected. The network interface 1212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more IC device design systems 1200.

The IC device design system 1200 is configured to receive information through the I/O interface 1210. The information received through the I/O interface 1210 includes one or a combination of at least one design rule instructions, at least one set of criteria, at least one design rule, at least one DRM, and/or other parameters for processing by the processor 1202. The information is transferred to the processor 1202 via the bus 1208. The IC device design system 1200 is configured to transmit and/or receive information related to a user interface through the I/O interface 1210.

The IC device design system 1200 also includes one or more fabrication tools 1224 coupled to the network 1214. The fabrication tools 1224 are configured to fabricate the IC layout designed by the IC device design system 1200. The fabrication tools 1224 includes deposition tools (e.g., chemical vapor deposition (CVD) apparatuses, physical vapor deposition (PVD) apparatuses), etching tools (e.g., dry etching apparatuses, wet etching apparatuses), planarization tools (e.g., CMP apparatuses), or other tools used in fabricating IC devices including the IC layout designed by the IC device design system 2300.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of the method M10 and M20 as discussed above with respect to FIGS. 3 and 4, the IC device design system 1200 and a non-transitory computer-readable storage medium, e.g., the non-transitory computer-readable storage medium 1204, enable the benefits discussed above with respect to the method M10 and M20 as discussed above with respect to FIGS. 3 and 4.

Figure 13:
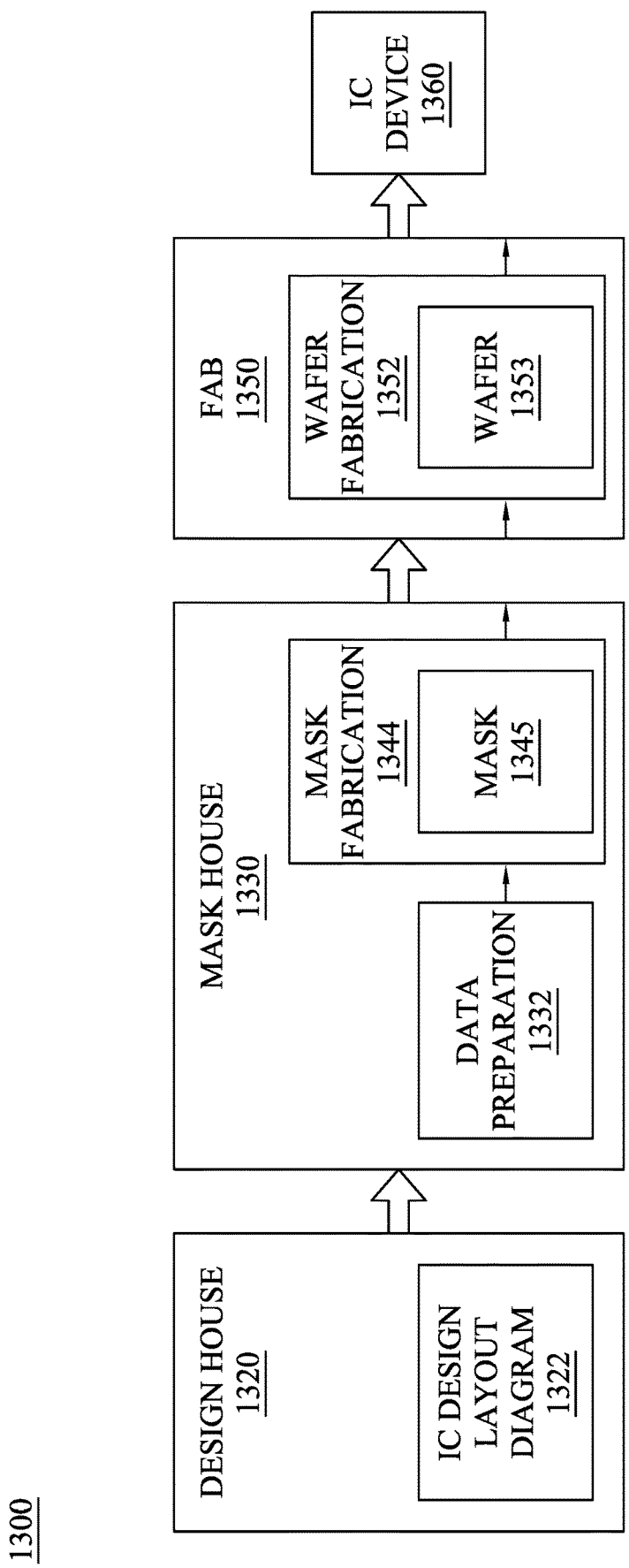
FIG. 13 is a block diagram of IC manufacturing system and an IC manufacturing flow associated therewith, in accordance with some embodiments of the present disclosure.

FIG. 13 is a block diagram of IC manufacturing system 1300 and an IC manufacturing flow associated therewith, in accordance with some embodiments of the present disclosure. In some embodiments, based on a layout design, at least one of (A) one or more semiconductor masks or (B) at least one component in a layer of a semiconductor IC is fabricated using the IC manufacturing system 1300.

In FIG. 13, the IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in IC manufacturing system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of the design house 1320, mask house 1330, and IC fab 1350 is owned by a single larger company. In some embodiments, two or more of design house 1320, mask house 1330, and IC fab 1350 coexist in a common facility and use common resources.

The design house (or design team) 1320 generates an IC design layout diagram (or design) 1322 based on the method M10 and M20 as discussed above with respect to FIGS. 3 and 4 and discussed above with respect to FIGS. 1A and 5A-11. The IC design layout diagram 1322 includes various geometrical patterns that correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 1320 implements a proper design procedure including the method M10 and M20 as discussed above with respect to FIGS. 3 and 4 and discussed above with respect to FIGS. 1A and 5A-11, to form IC design layout diagram 1322. The design procedure includes one or more of logic design, physical design or place and route. The IC design layout diagram 1322 is presented in one or more data files having information of the geometrical patterns. For example, the IC design layout diagram 1322 can be expressed in a GDSII file format or DFII file format.

The mask house 1330 includes data preparation 1332 and mask fabrication 1344. Mask house 1330 uses the IC design layout diagram 1322 to manufacture one or more masks 1345 to be used for fabricating the various layers of IC device 1360 according to IC design layout diagram 1322. The mask house 1330 performs mask data preparation 1332, where the IC design layout diagram 1322 is translated into a representative data file ("RDF"). The mask data preparation 1332 provides the RDF to mask fabrication 1344. The mask fabrication 1344 includes a mask writer. A mask writer converts the RDF to an image on a substrate, such as a mask (reticle) 1345 or a semiconductor wafer 1353. The design layout diagram 1322 is manipulated by mask data preparation 1332 to comply with particular characteristics of the mask writer and/or requirements of the IC fab 1350. In FIG. 13, the mask data preparation 1332 and mask fabrication 1344 are illustrated as separate elements. In some embodiments, the mask data preparation 1332 and mask fabrication 1344 are collectively referred to as mask data preparation.

In some embodiments, the mask data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, the mask data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, the mask data preparation 1332 includes lithography process checking (LPC) that simulates processing that will be implemented by the IC fab 1350 to fabricate the IC device 1360. LPC simulates this processing based on the IC design layout diagram 1322 to create a simulated manufactured device, such as the IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 1322.

It should be understood that the above description of the mask data preparation 1332 has been simplified for the purposes of clarity. In some embodiments, the mask data preparation 1332 includes additional features such as a logic operation (LOP) to modify the IC design layout diagram 1322 according to manufacturing rules. Additionally, the processes applied to the IC design layout diagram 1322 during the mask data preparation 1332 may be executed in a variety of different orders.

After the mask data preparation 1332 and during the mask fabrication 1344, a mask 1345 or a group of masks 1345 are fabricated based on the modified IC design layout diagram 1322. In some embodiments, the mask fabrication 1344 includes performing one or more lithographic exposures based on the IC design layout diagram 1322. In some embodiments, an electron-beam (e-beam) or a mechanism of multiple e-beams is used to form a pattern on a mask (photomask or reticle) 1345 based on the modified IC design layout diagram 1322. The mask 1345 can be formed in various technologies. In some embodiments, the mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1345 includes a transparent substrate (e.g., fused quartz) and an opaque material (e.g., chromium) coated in the opaque regions of the binary mask. In another example, the mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in the semiconductor wafer 1353, in an etching process to form various etching regions in the semiconductor wafer 1353, and/or in other suitable processes.

The IC fab 1350 includes wafer fabrication 1352. The IC fab 1350 is an IC fabrication business that includes one or more manufacturing facilities for the fabrication of a variety of different IC products. In some embodiments, the IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

The IC fab 1350 uses the mask(s) 1345 fabricated by mask house 1330 to fabricate the IC device 1360. Thus, the IC fab 1350 at least indirectly uses IC design layout diagram 1322 to fabricate the IC device 1360. In some embodiments, the semiconductor wafer 1353 is fabricated by the IC fab 1350 using the mask(s) 1345 to form the IC device 1360. In some embodiments, the IC fabrication includes performing one or more lithographic exposures based at least indirectly on the IC design layout diagram 1322. The semiconductor wafer 1353 includes a silicon substrate or other proper substrate having material layers formed thereon. The semiconductor wafer 1353 further includes one or more of various doped regions, dielectric features, multilevel interconnects, and the like (formed at subsequent manufacturing steps).

According to some embodiments, a method of generating an integrated circuit (IC) layout diagram includes arranging first conductive feature layout patterns in a cell region. The first conductive feature layout patterns extend in a first direction, and the cell region has opposite first and second cell boundaries extending in a second direction different from the first direction. Second conductive feature layout patterns are arranged in the cell region. The second conductive feature layout patterns extend in the first direction, and the first and second conductive feature layout patterns are alternately arranged in the second direction. First cut feature layout patterns are arranged on the first cell boundary of the cell region and on ends of the first conductive feature layout patterns. One of the first cut feature layout patterns is offset from another one of the first cut feature layout patterns in the first direction. The IC layout diagram including the first and second conductive feature layout patterns and the first cut feature layout patterns is generated.

According to some embodiments, a device includes a first cell, a second cell, and first isolation portions. The second cell is adjacent the first cell. The first and second cells are arranged in a first direction, and the first cell includes first and second conductive structures. The first conductive structures extend in the first direction. Each of the first conductive structures has a first end facing the second cell. The second conductive structures extend in the first direction. The first and second conductive structures are alternately arranged in a second direction different from the first direction. The first isolation portions are respectively abutting the first ends of the first conductive structures. Two of the first isolation portions are misaligned with each other in the second direction.

According to some embodiments, a system for designing an integrated circuit includes a non-transitory computer readable medium and a processor. The non-transitory computer readable medium is configured to store executable instructions. The processor is coupled to the non-transitory computer readable medium. The processor is configured to execute the instructions for arranging first conductive feature layout patterns in a cell region, wherein the first conductive feature layout patterns extend in a first direction, and the cell region has opposite first and second cell boundaries extending in a second direction different from the first direction; arranging second conductive feature layout patterns in the cell region, wherein the second conductive feature layout patterns extend in the first direction, and the first and second conductive feature layout patterns are alternately arranged in the second direction; and arranging first cut feature layout patterns on the first cell boundary of the cell region and on ends of the first conductive feature layout patterns, wherein one of the first cut feature layout patterns is offset from another one of the first cut feature layout patterns in the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first cell and a second cell adjacent the first cell, wherein the first and second cells are arranged in a first direction, and the first cell comprises:
first conductive structures extending in the first direction, wherein the first conductive structures have first ends facing the second cell; and
second conductive structures extending in the first direction, wherein the first and second conductive structures are arranged in a second direction different from the first direction, and one of the second conductive structures is between adjacent two of the first conductive structures; and
first dielectric isolation portions respectively abutting the first ends of the first conductive structures, wherein two of the first dielectric isolation portions are misaligned with each other in the second direction.

2. The device of claim 1, wherein the first conductive structures have a pitch, and centers of the two of the first dielectric isolation portions have a distance substantially n times the pitch, wherein n is a positive integer.

3. The device of claim 1, wherein a cell boundary is between the first and second cells, and the two of the first dielectric isolation portions are on opposite sides of the cell boundary.

4. The device of claim 1, wherein a pitch of the first conductive structures is substantially the same as a pitch of the second conductive structures.

5. The device of claim 1, further comprising second dielectric isolation portions respectively abutting second ends of the second conductive structures.

6. The device of claim 1, further comprising a first via below and in direct contact with one of the first conductive structures.

7. The device of claim 1, further comprising a second via on and in direct contact with one of the first conductive structures.

8. A device comprising:
a first cell and a second cell adjacent the first cell, wherein the first and second cells are arranged in a first direction, and the first cell comprises:
first conductive structures; and
second conductive structures arranged in a second direction different from the first direction, and one of the second conductive structures is between adjacent two of the first conductive structures; and
first dielectric isolation portions respectively abutting ends of the first conductive structures, wherein two of the first dielectric isolation portions are misaligned with each other in the second direction, and a distance between the two of the first dielectric isolation portions in the first direction is less than a width of each of the first dielectric isolation portions in the first direction.

9. The device of claim 8, wherein the first cell further comprises:
second dielectric isolation portions respectively abutting ends of the second conductive structures.

10. The device of claim 9, wherein the second dielectric isolation portions are aligned with one of the two of the first dielectric isolation portions.

11. The device of claim 9, wherein one of the second dielectric isolation portions overlaps one of the two of the first dielectric isolation portions.

12. The device of claim 9, wherein one of the second dielectric isolation portions abuts a sidewall of one of the first conductive structures.

13. The device of claim 9, wherein the first cell further comprises a via over one of the first conductive structures, wherein a portion of the via is directly between two of the second dielectric isolation portions.

14. The device of claim 9, wherein the first cell further comprises a via over one of the first conductive structures, wherein each of the second dielectric isolation portions has a width in the first direction, and the width of the second dielectric isolation portions is greater than a distance between the via and the end of said one of the first conductive structures.

15. A device comprising:
a first cell and a second cell adjacent the first cell, wherein the first and second cells are arranged in a first direction, and the first cell comprises first conductive structures and second conductive structures arranged in a second direction different from the first direction, and one of the second conductive structures is between adjacent two of the first conductive structures;
first dielectric isolation portions respectively abutting ends of the first conductive structures, wherein two of the first dielectric isolation portions are misaligned with each other in the second direction; and
second dielectric isolation portions respectively abutting ends of the second conductive structures, wherein one of the second dielectric isolation portions is aligned with a first one of the two of the first dielectric isolation portions and misaligned with a second one of the two of the first dielectric isolation portions.

16. The device of claim 15, wherein a width of each of the second dielectric isolation portions in the first direction is greater than a distance between the two of the first dielectric isolation portions in the first direction.

17. The device of claim 15, wherein said one of the second dielectric isolation portions abuts the first one of the two of the first dielectric isolation portions.

18. The device of claim 15, wherein a length of a first one of the first conductive structures is different from a length of a second one of the first conductive structures.

19. The device of claim 18, wherein a difference between the length of the first one of the first conductive structures and the length of the second one of the first conductive structures is smaller than a width of each of the first dielectric isolation portions in the first direction.

20. The device of claim 18, wherein a difference between the length of the first one of the first conductive structures and the length of the second one of the first conductive structures is smaller than a width of each of the second dielectric isolation portions in the first direction.

* * * * *